(12) United States Patent
Fujimori et al.

(10) Patent No.: US 9,871,166 B2
(45) Date of Patent: Jan. 16, 2018

(54) LIGHT EMITTING DEVICE

(71) Applicant: ROHM CO., LTD., Kyoto (JP)

(72) Inventors: Takao Fujimori, Kyoto (JP); Tomohito Kawase, Kyoto (JP); Yasuo Nakanishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/600,528

(22) Filed: Jan. 20, 2015

(65) Prior Publication Data

US 2015/0214428 A1 Jul. 30, 2015

(30) Foreign Application Priority Data

Jan. 20, 2014 (JP) .................................. 2014-008003
Jan. 20, 2014 (JP) .................................. 2014-008004
Jan. 16, 2015 (JP) .................................. 2015-006748

(51) Int. Cl.
*H01L 33/20* (2010.01)
*H01L 33/42* (2010.01)
*H01L 33/38* (2010.01)

(52) U.S. Cl.
CPC ............ *H01L 33/20* (2013.01); *H01L 33/382* (2013.01); *H01L 33/42* (2013.01);
(Continued)

(58) Field of Classification Search
CPC ....... H01L 33/20; H01L 33/382; H01L 33/42; H01L 2224/48091; H01L 2224/49107; H01L 2224/73265
(Continued)

(56) References Cited

U.S. PATENT DOCUMENTS 7,683,386 B2 * 3/2010 Tanaka ................ H01L 21/0237
257/88
2004/0124422 A1 7/2004 Sakamoto et al.
(Continued)

FOREIGN PATENT DOCUMENTS

JP 2004-221529 A 8/2004
JP 2006-253647 A 9/2006
(Continued)

*Primary Examiner* — Ori Nadav
(74) *Attorney, Agent, or Firm* — Rabin & Berdo, P.C.

(57) ABSTRACT

The light emitting device 1 includes a substrate 2, and an n-type conductive type semiconductor layer 3, a light emitting layer 4 and a p-type conductive type semiconductor layer 5 laminated in series on a surface 2A of the substrate 2. The light emitting layer 4, the p-type conductive type semiconductor layer 5, and a portion of the n-type conductive type semiconductor layer 3 excluding the vicinity of the peripheral portion compose a semiconductor laminate structure portion 6. A p-side transparent electrode layer 14 is formed on a surface of the p-type conductive type semiconductor layer 5. The p-side transparent electrode 14 covers a substantially whole area of a predetermined current injection region 13 on a surface of the p-type conductive type semiconductor layer 5. A p-side electrode 15 is formed on a surface of the p-side transparent electrode layer 14. A plurality of concave portions 16, which penetrate the p-side transparent electrode layer 14 and enter the semiconductor laminate structure portion 6, are formed on a surface of the p-side transparent electrode layer 14.

15 Claims, 28 Drawing Sheets

(52) U.S. Cl.
CPC .............. *H01L 2224/48091* (2013.01); *H01L 2224/49107* (2013.01); *H01L 2224/73265* (2013.01)

(58) Field of Classification Search
USPC .................................. 257/13, 88, 91, 94–98
See application file for complete search history.

(56) References Cited

U.S. PATENT DOCUMENTS

| | | |
|---|---|---|
| 2005/0179130 A1 | 8/2005 | Tanaka et al. |
| 2006/0044803 A1* | 3/2006 | Edwards .................. F21K 9/00 362/294 |
| 2009/0127539 A1 | 5/2009 | Shakuda |
| 2010/0019257 A1 | 1/2010 | Sakai et al. |
| 2014/0001508 A1 | 1/2014 | Tasaki et al. |

FOREIGN PATENT DOCUMENTS

| | | |
|---|---|---|
| JP | 2009-123836 A | 6/2009 |
| JP | 2011-077562 A | 4/2011 |
| WO | WO 2012-120894 A1 | 9/2012 |

* cited by examiner

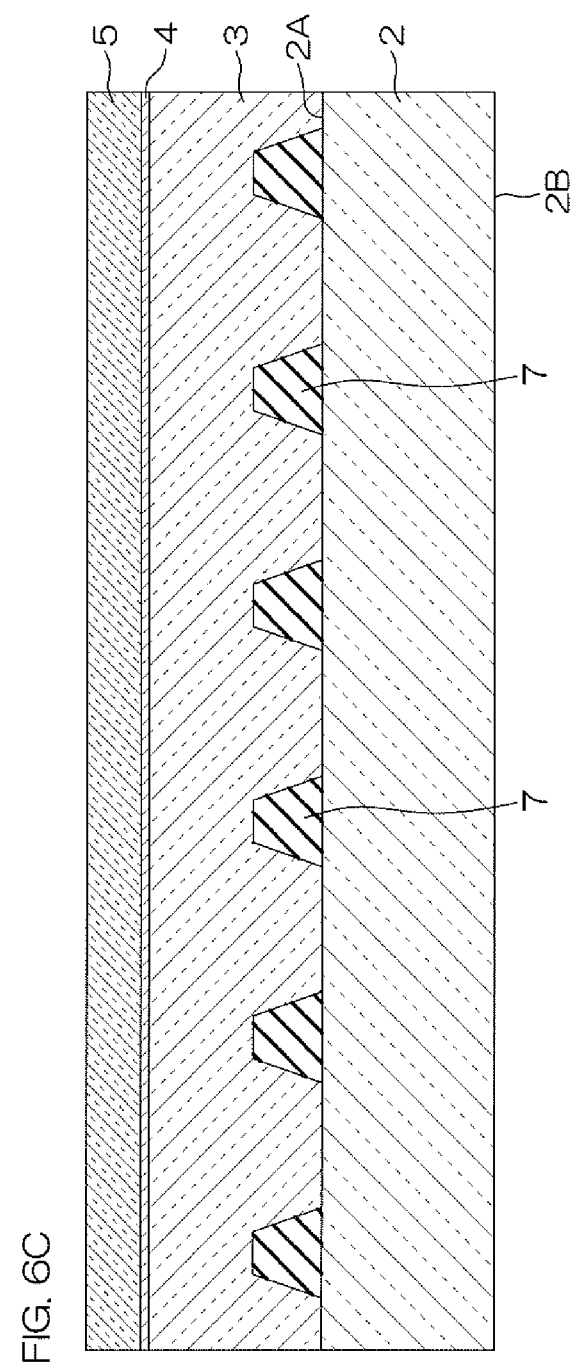

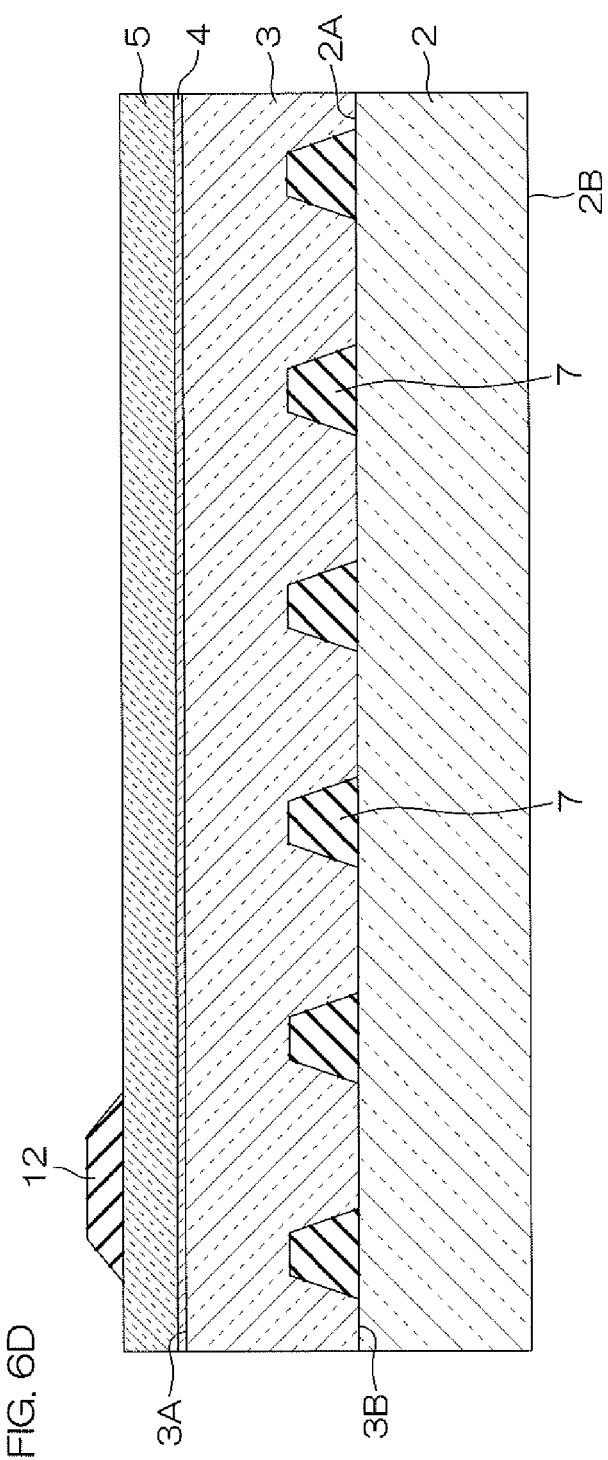

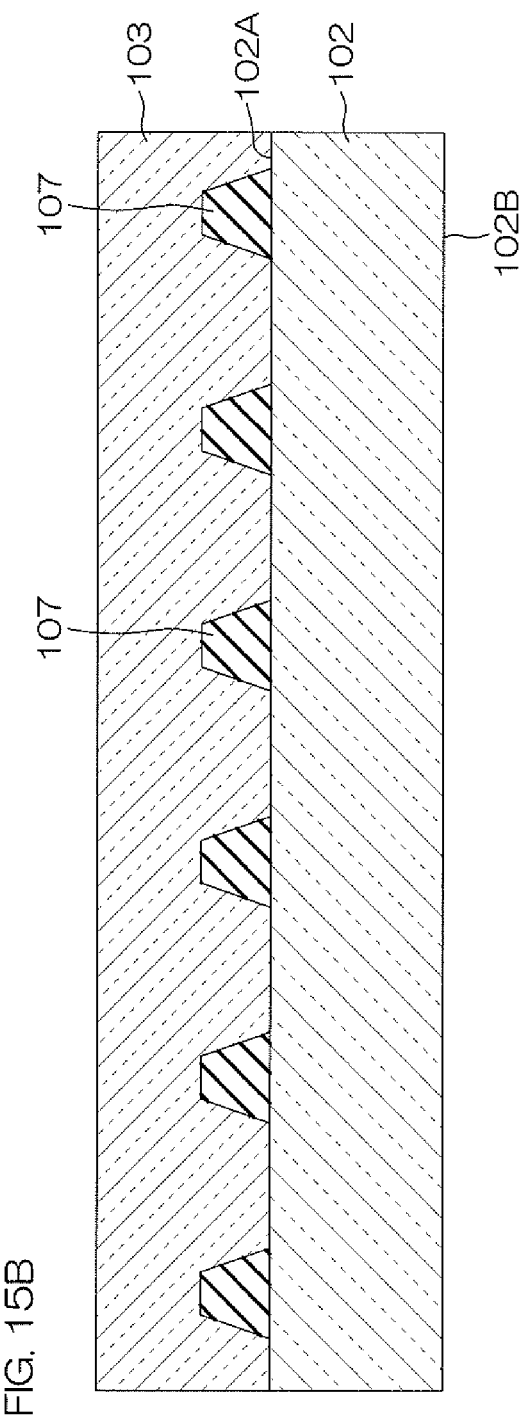

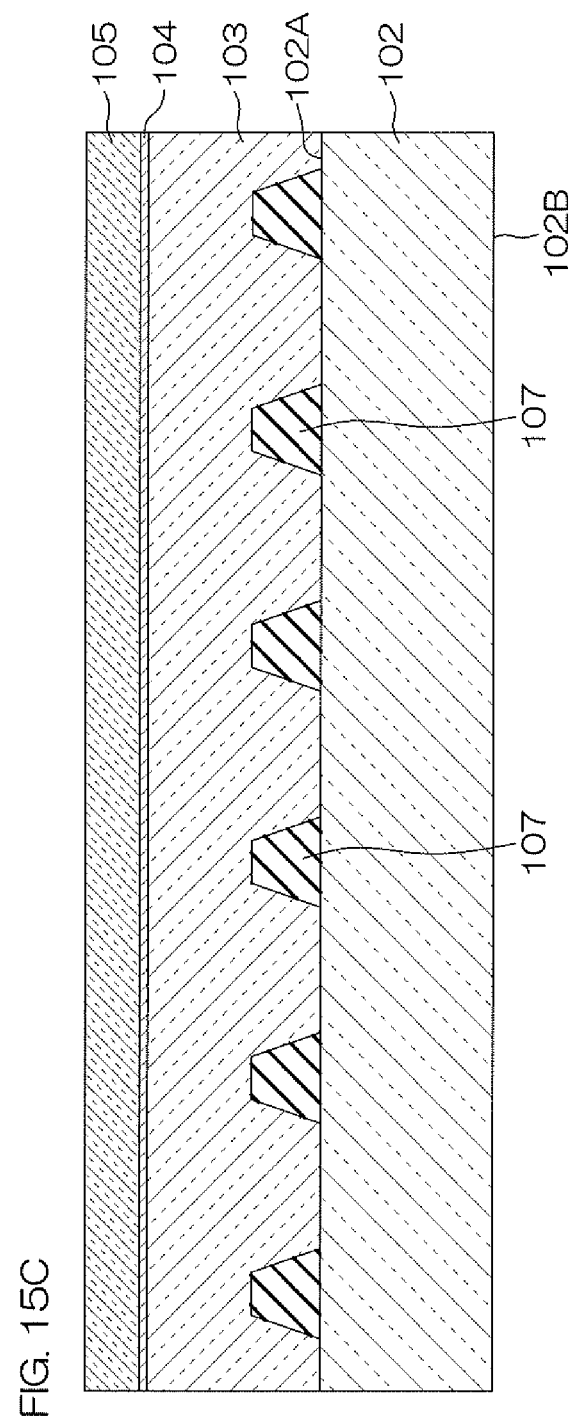

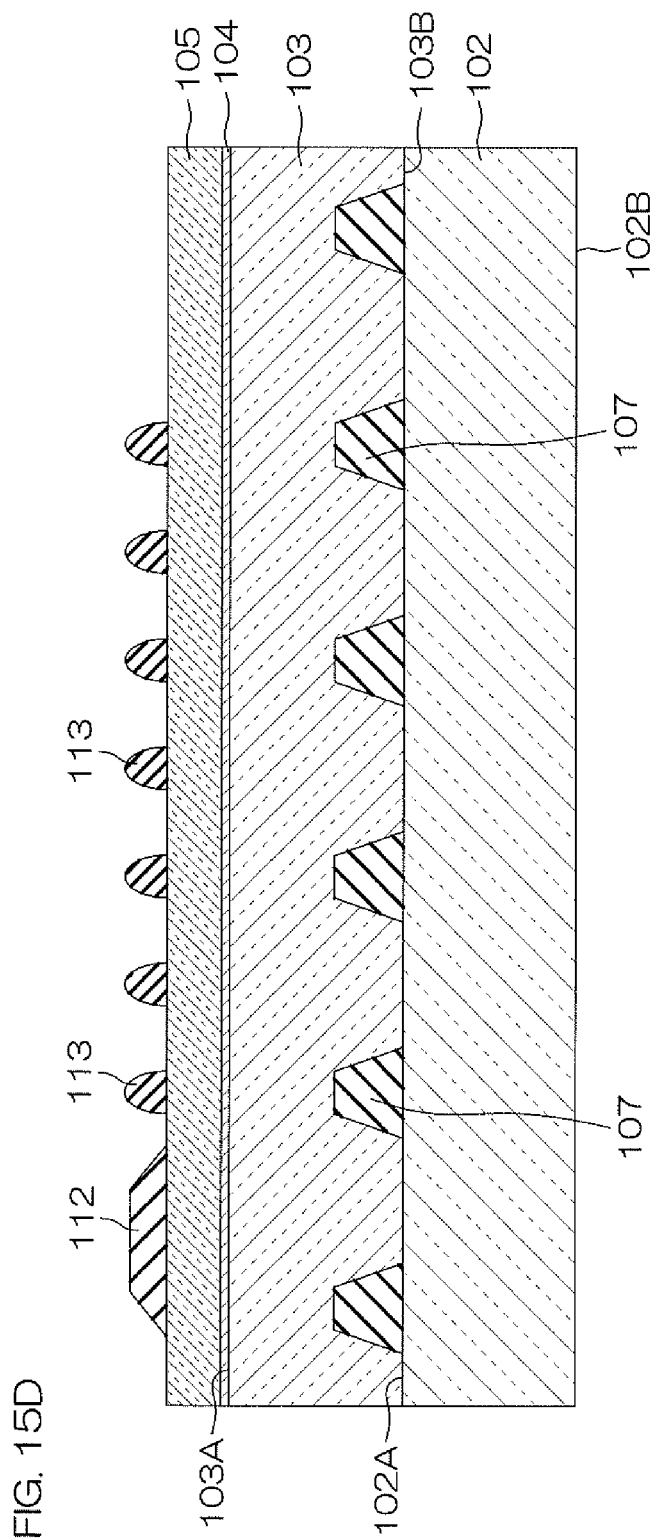

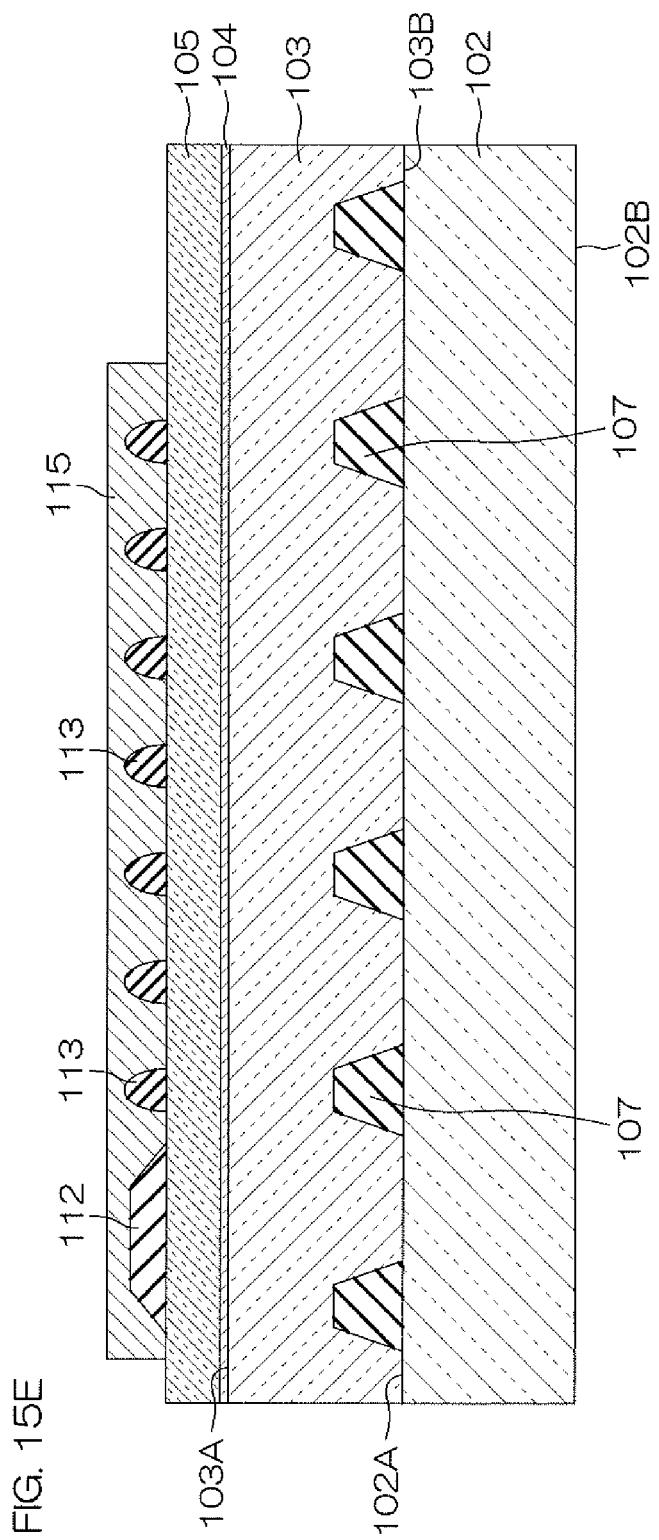

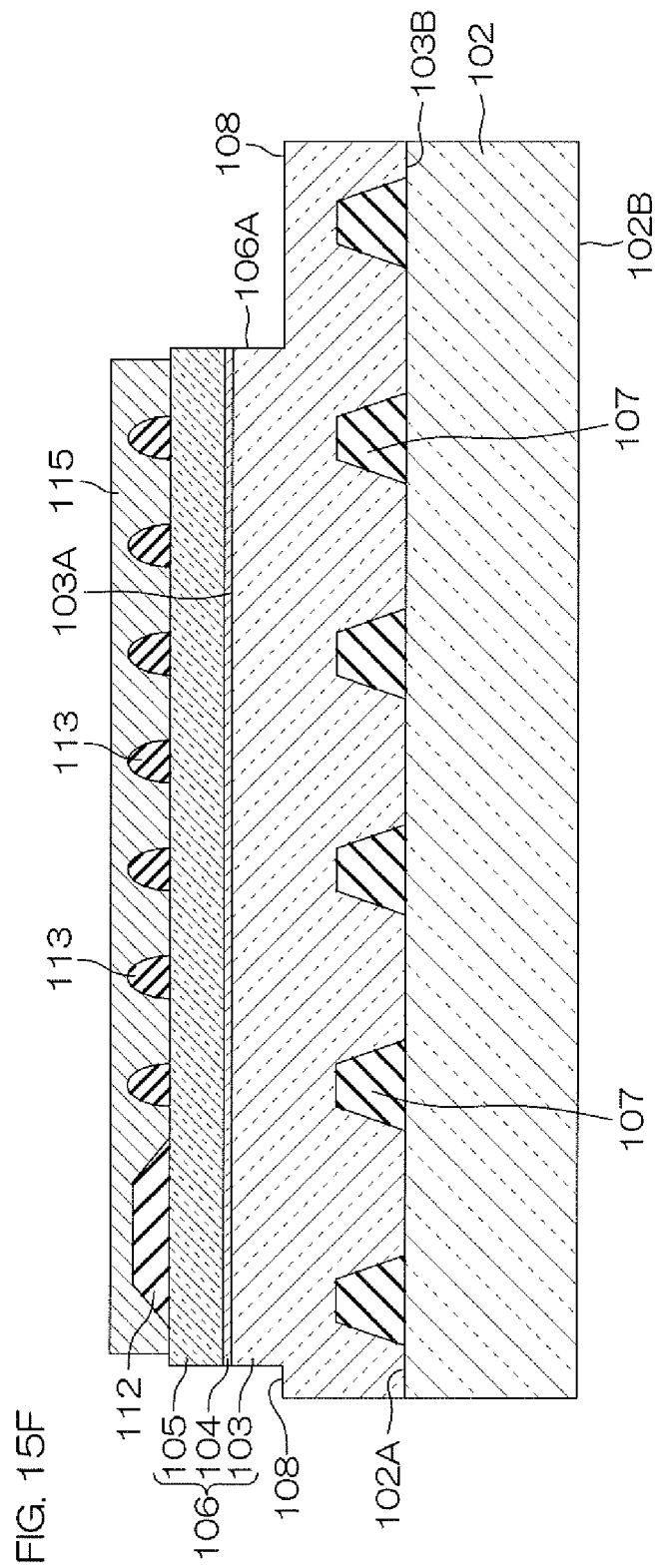

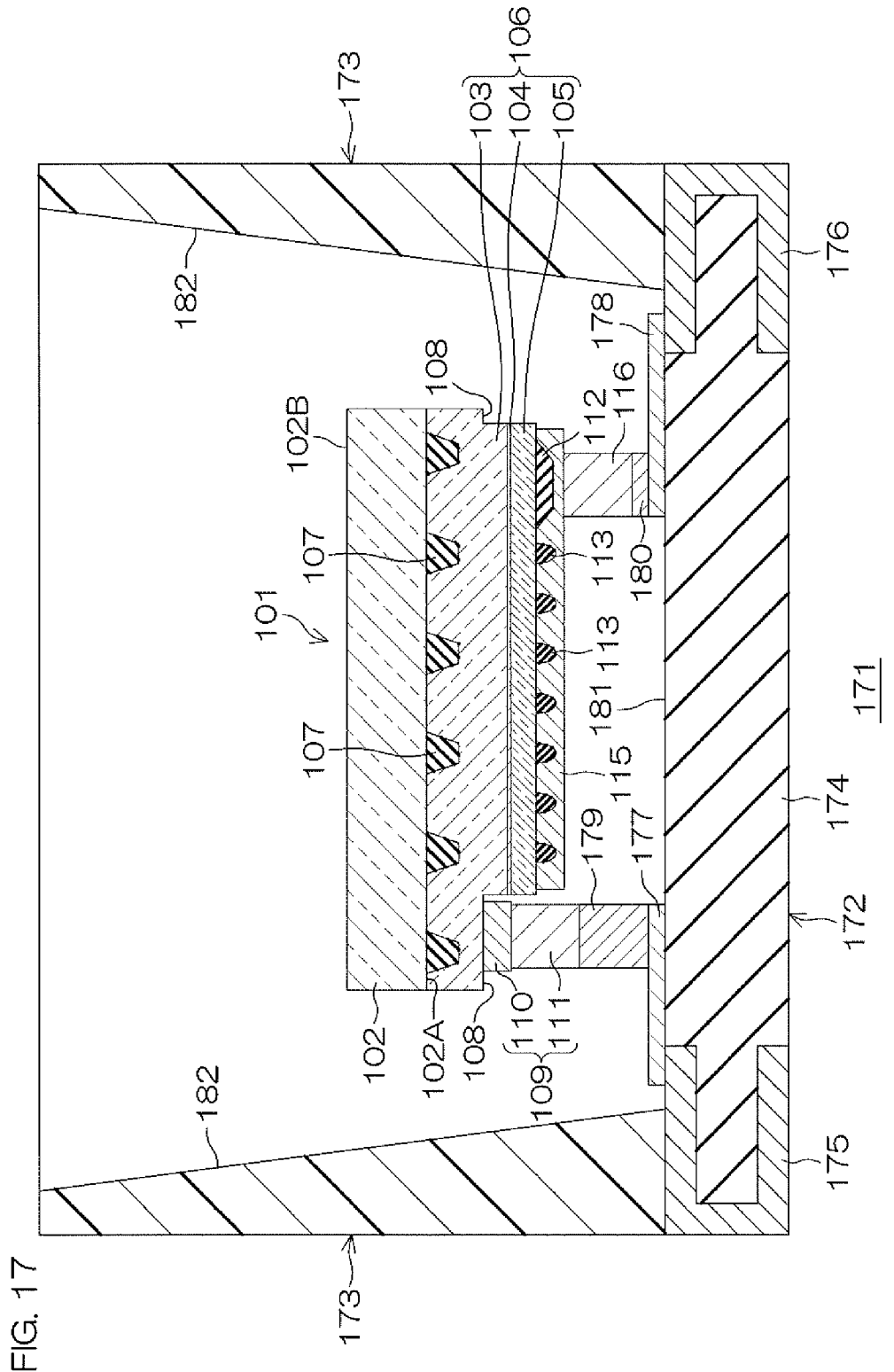

LIGHT EMITTING DEVICE

BACKGROUND OF THE INVENTION

1. Field of the Invention

The present invention relates to a light emitting device.

2. Description of the Related Art

One of the well-known light emitting devices is drawn in FIGS. 3 and 4 of Patent Document (Japanese Patent Application Publication No. 2004-221529). The light emitting device described in Patent Document includes a sapphire substrate, and a laminate structure composed of a GaN buffer layer, a non-doped GaN layer, a Si-doped GaN layer (n-type contact layer), a Si-doped GaN layer (n-type clad layer), an InGaN layer (active layer), a Mg-doped AlGaN layer (p-type clad layer) and a Mg-doped GaN layer (p-type contact layer) which are laminated in series on a surface of the sapphire substrate. The p-type contact layer, the p-type clad layer, the active layer, the n-type clad layer and the n-type contact layer are partially removed, and an n-side electrode is formed on an exposed surface of the n-type contact layer. Moreover, a p-side electrode is formed on the p-type contact layer.

The p-side electrode is composed of a p-side current diffusion portion (p-side transparent electrode layer) having translucency, and a p-side pad portion, which is formed at a predetermined portion of the p-side current diffusion portion and does not have translucency. A plurality of openings (through holes) are formed in the p-side current diffusion portion. The openings are formed in order to allow light extraction while reducing the electric resistance of the p-side current diffusion portion even when the p-side current diffusion portion is formed to have a thickness to lose translucency.

SUMMARY OF THE INVENTION

An object of the present invention is to provide a light emitting device capable of improving light extraction efficiency.

A light emitting device according to the present invention includes a substrate having a surface and a rear surface, a semiconductor laminate structure portion having an n-type semiconductor layer, a light emitting layer and a p-type semiconductor layer which are laminated in series on the surface of the substrate, a transparent electrode layer which is formed on a surface of the p-type semiconductor layer on a side opposite to the light emitting layer and covers the whole area or a substantially whole area of a predetermined current injection region on the surface, a p-side electrode which is formed on a surface of the transparent electrode layer on a side opposite to the p-type semiconductor layer, and a plurality of concave portions which are formed in the current injection region on a surface of the semiconductor laminate structure portion on the p-type semiconductor layer side.

In such a structure, light propagated in the semiconductor laminate structure portion is reflected at a side surface of an inner wall surface of a concave portion and is extracted to the transparent electrode layer side, and therefore the light extraction efficiency can be improved.

A preferred embodiment of the present invention further includes a lead portion which is electrically connected with the n-type semiconductor layer and is extended from the semiconductor laminate structure portion in a direction parallel to the substrate, and an n-side electrode formed on the lead portion.

In a preferred embodiment of the present invention, each of the plurality of concave portions extends up to the n-type semiconductor layer.

In such a structure, the area of a side surface of the inner wall surface of a concave portion becomes larger than a case where a concave portion does not extend up to the n-type semiconductor layer, and therefore the light extraction efficiency can be improved. Although the area of the light emitting layer decreases when a concave portion is formed to extend up to the n-type semiconductor layer, the light extraction effect by the concave portion enables extraction of light, which is generated in the light emitting layer, from the light emitting layer before absorption of the light in the light emitting layer, and therefore the light extraction efficiency can be improved.

In a preferred embodiment of the present invention, a plurality of convex portions covered with the n-type semiconductor layer are formed on the surface of the substrate, and the plurality of concave portions include a concave portion which is located to face a portion in the n-type semiconductor layer where a defect is likely to occur.

In such a structure, a plurality of convex portions are formed on the surface of the substrate, and therefore it is possible to suppress total reflection of light at the interface between the substrate and the n-type semiconductor layer. This can improve the light extraction efficiency.

Moreover, in such a structure, the plurality of concave portions include a concave portion which is located to face a portion in the n-type semiconductor layer where a defect is likely to occur. This makes it difficult for electric current from the transparent electrode side to flow to the portion in the n-type semiconductor layer where a defect portion is likely to occur. This can suppress concentrated flow of electric current to a defect portion in the n-type semiconductor layer, and therefore reliability of the light emitting device can be improved.

In a preferred embodiment of the present invention, the plurality of concave portions include a concave portion which is located to face each of the plurality of convex portions.

In a case where a plurality of convex portions are formed on the surface of the substrate, since lateral growth joins crystal growth of the n-type semiconductor layer on the substrate in regions in the n-type semiconductor layer right above the centers of the convex portions, a defect portion is likely to occur in the regions. In such a structure, the plurality of concave portions include a concave portion which is located to face each of the plurality of convex portions. This makes it difficult for electric current from the transparent electrode side to flow to a portion in the n-type semiconductor layer where a defect portion is likely to occur. This can suppress concentrated flow of electric current to a defect portion in the n-type semiconductor layer, and therefore reliability of the light emitting device can be improved.

In a preferred embodiment of the present invention, the plurality of concave portions include a concave portion which is located to face a central position of a plurality of two-dimensionally adjacent convex portions among the plurality of convex portions.

In a case where a plurality of convex portions are formed on the surface of the substrate, defect of the substrate is likely to be taken over and a defect portion is likely to occur in a region in the n-type semiconductor layer right above a central position of a plurality of two-dimensionally adjacent convex portions. In such a structure, the plurality of concave portions include a concave portion which is located to face a central position of two-dimensionally adjacent convex portions among the plurality of convex portions. This makes it difficult for electric current from the transparent electrode side to flow to a portion in the n-type semiconductor layer where a defect portion is likely to occur. This can suppress concentrated flow of electric current to a defect portion in the n-type semiconductor layer, and therefore reliability of the light emitting device can be improved.

In a preferred embodiment of the present invention, an insulating film is formed on an inner wall surface of the concave portions. In such a structure, it becomes more difficult for electric current to flow to a defect portion in the n-type semiconductor layer. This can suppress concentrated flow of electric current to a defect portion more effectively, and therefore reliability of the light emitting device can be further improved.

In a preferred embodiment of the present invention, the convex portion is constituted of an insulating film formed on the surface of the substrate.

In a preferred embodiment of the present invention, the convex portion is formed by etching the surface of the substrate.

BRIEF DESCRIPTION OF THE DRAWINGS

FIG. 6C is a schematic sectional view illustrating a process following FIG. 6B.

FIG. 6D is a schematic sectional view illustrating a process following FIG. 6C.

FIG. 15B is a schematic sectional view illustrating a process following FIG. 15A.

FIG. 15C is a schematic sectional view illustrating a process following FIG. 15B.

FIG. 15D is a schematic sectional view illustrating a process following FIG. 15C.

FIG. 15E is a schematic sectional view illustrating a process following FIG. 15D.

FIG. 15F is a schematic sectional view illustrating a process following FIG. 15E.

FIG. 17 is a schematic sectional view illustrating another example of a light emitting device package.

DESCRIPTION OF THE PREFERRED EMBODIMENTS

The following description will give a detailed explanation on preferred embodiments of the first invention and the second invention with reference to the accompanying drawings.

[1] First Invention

A preferred embodiment of the first invention will be described in detail with reference to the accompanying drawings.

Figure 1:
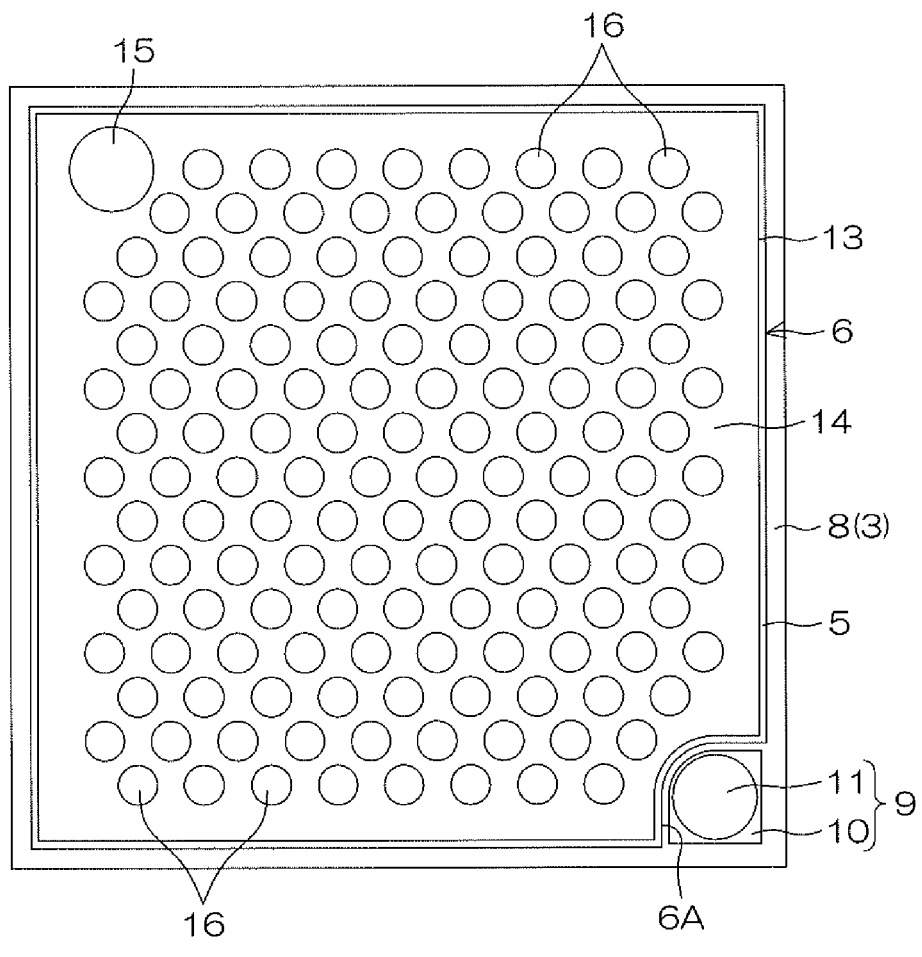
FIG. 1 is a schematic plan view of a light emitting device according to a preferred embodiment of a first invention.
Figure 2:
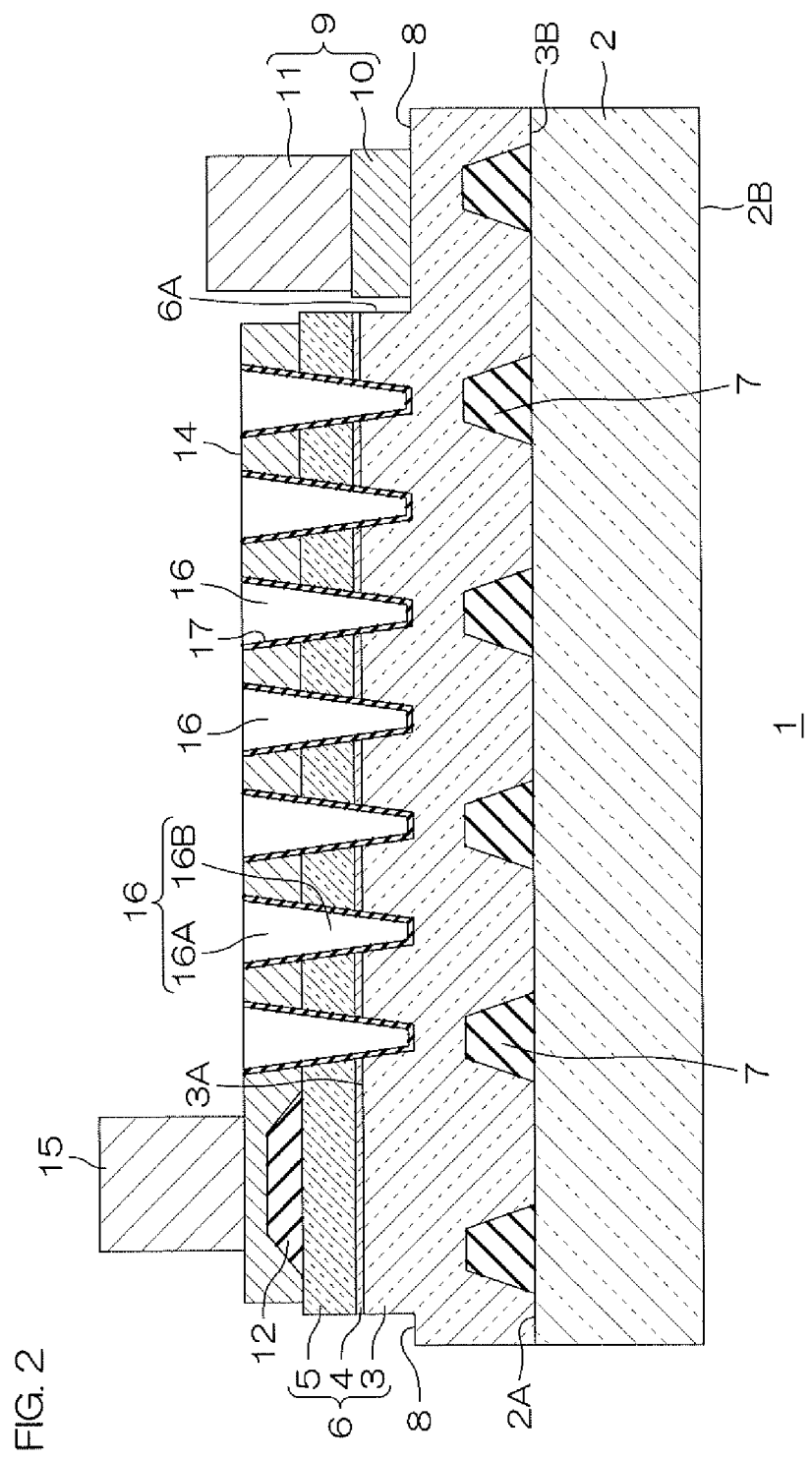
FIG. 2 is a schematic sectional view of the light emitting device in FIG. 1.

FIG. 1 is a schematic plan view of a light emitting device according to a preferred embodiment of the first invention. FIG. 2 is a schematic sectional view of the light emitting device in FIG. 1.

A light emitting device 1 is a rectangular chip at a planar view. The light emitting device 1 includes a substrate 2 having a surface 2A and a rear surface 2B, and an n-type conductive type semiconductor layer 3, a light emitting layer 4 and a p-type conductive type semiconductor layer 5 which are laminated in series on the surface 2A of the substrate 2. The n-type conductive type semiconductor layer 3 will be hereinafter referred to as "n-type semiconductor layer 3," and the p-type conductive type semiconductor layer 5 will be hereinafter referred to as "p-type semiconductor layer 5." The substrate 2 is a rectangular shape at a planar view. The light emitting layer 4, the p-type semiconductor layer 5, and a portion of the n-type semiconductor layer 3 excluding the vicinity of the peripheral portion compose a semiconductor laminate structure portion 6. The semiconductor laminate structure portion 6 is a rectangular shape substantially approximate to the substrate 2 at a planar view, and has a cutout portion 6A at one corner portion. A side surface of the cutout portion 6A is formed to have a curved surface which protrudes inward at a planar view.

The substrate 2 is made of material (e.g., sapphire, GaN or SiC) which is transparent to the emission wavelength λ (e.g., 450 nm) of the light emitting layer 4. "Transparent to emission wavelength" specifically denotes a case where the transmittance of the emission wavelength is equal to or higher than 60%, for example. In this preferred embodiment, the substrate 2 is a sapphire substrate. The substrate 2 has a thickness of 200 μm to 300 μm, for example.

Figure 3A:
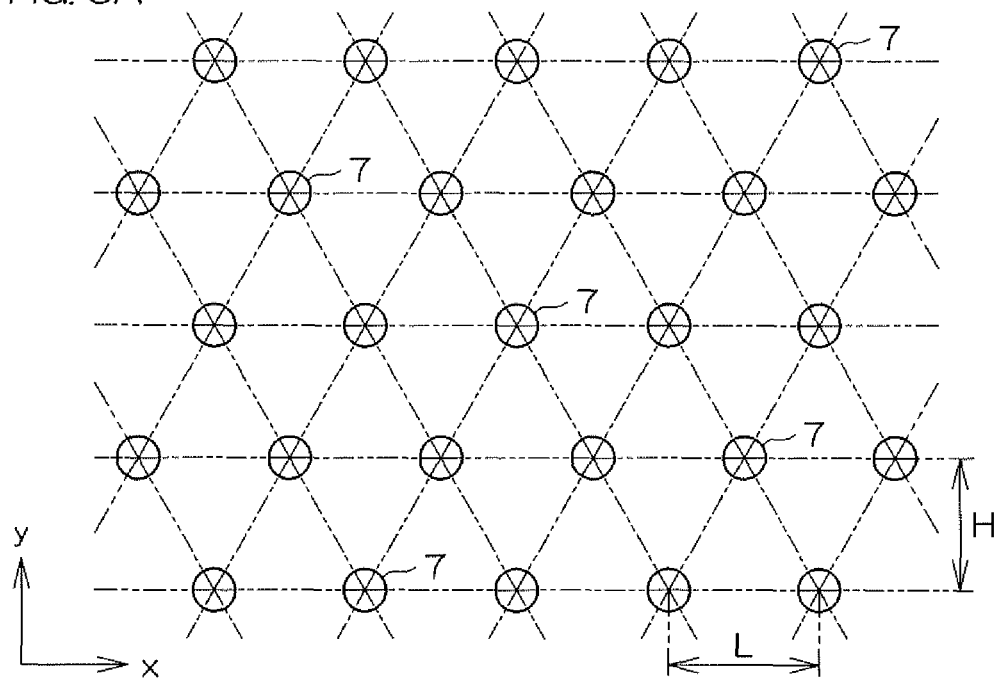
FIG. 3A is a schematic plan view illustrating an example of an arrangement pattern of convex portions.

A plurality of frustum convex portions 7 which protrude to the n-type semiconductor layer 3 are formed on the surface 2A of the substrate 2. The convex portions 7 are arranged discretely as illustrated in FIG. 3A. In FIG. 3A, a direction along one side of two adjacent sides of the surface 2A of the substrate 2 at a planar view is represented as an x-direction, and a direction along the other side is represented as a y-direction. In this preferred embodiment, the plurality of convex portions 7 are formed on the surface 2A of the substrate 2 in a pattern where the convex portions 7 are arranged at the respective vertexes and centers (centers of gravity) of each regular hexagon in aggregate of regular hexagons at a planar view. In other words, the plurality of convex portions 7 are formed on the surface 2A of the substrate 2 in a pattern where the convex portions 7 are arranged at the respective vertexes of six regular triangles which compose each regular hexagon in aggregate of regular hexagons. In this preferred embodiment, each convex portion 7 is formed of SiN. Each convex portion 7 may be formed by etching the surface 2A of the substrate 2.

Figure 3B:
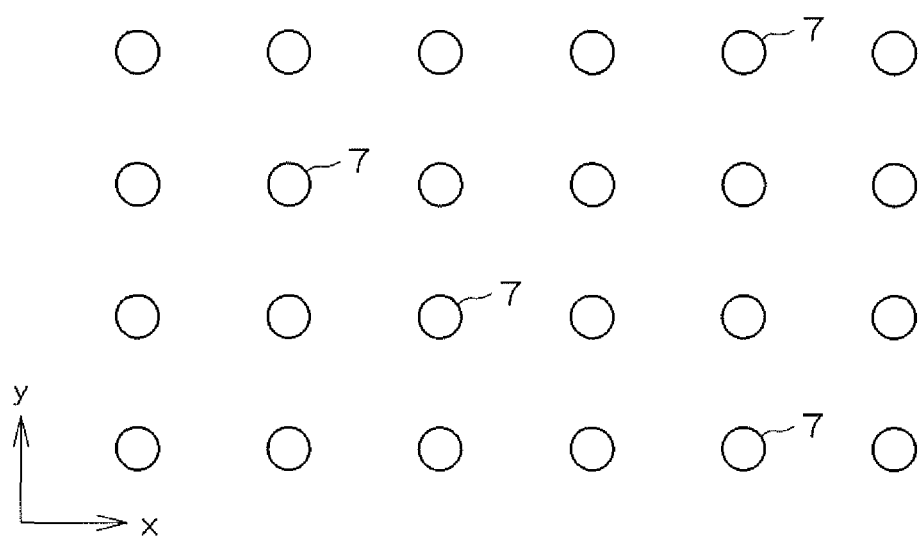
FIG. 3B is a schematic plan view illustrating another example of an arrangement pattern of convex portions.

The plurality of convex portions 7 may be arranged in a matrix at intervals as illustrated in FIG. 3B.

Since the convex portions 7 are formed on the surface 2A of the substrate 2, it is possible to suppress total reflection of light at the interface between the surface 2A of the substrate 2 and the n-type semiconductor layer 3. This can improve the light extraction efficiency. For example, it is possible to suppress total reflection of light, which is reflected at the rear surface 2B of the substrate 2 and enters the interface between the substrate 2 and the n-type semiconductor layer 3 at various angles, at the interface to the rear surface 2B side of the substrate 2. This can improve the light extraction efficiency.

The n-type semiconductor layer 3 is laminated on the surface 2A of the substrate 2. The n-type semiconductor layer 3 covers the whole area of the surface 2A of the substrate 2. All convex portions 7 are covered with the n-type semiconductor layer 3. The n-type semiconductor layer 3 is made of n-type GaN, and is transparent to the emission wavelength λ of the light emitting layer 4.

Regarding the n-type semiconductor layer 3, a lower surface covering the surface 2A of the substrate 2 in FIG. 2 will be referred to as a rear surface 3B, and an upper surface on a side opposite to the rear surface 3B will be referred to as a surface 3A. From a general standpoint, the surface 3A of the n-type semiconductor layer 3 includes a higher position region in a central portion and a lower position region, which is located around the higher position region and is lower than the higher position region. This forms a step at a boundary portion between the higher position region and the lower position region on the surface 3A of the n-type semiconductor layer 3.

The n-type semiconductor layer 3 in the higher position region constitutes an n-type semiconductor layer in the semiconductor laminate structure portion 6. The n-type semiconductor layer 3 in the lower position region will be referred to as a lead portion 8 extended from the semiconductor laminate structure portion 6. A side surface of the lead portion 8 is extended outward up to a position flush with a side surface of the substrate 2. The lead portion 8 is formed to surround the semiconductor laminate structure portion 6.

On a surface of the lead portion 8, an n-side electrode 9 is formed in contact with a region corresponding to the cutout portion 6A of the semiconductor laminate structure portion 6A. The n-side electrode 9 is composed of an n-side transparent electrode layer 10, which is formed on a surface of the lead portion 8, and an n-side pad 11, which is formed on the n-side transparent electrode layer 10. The n-side transparent electrode layer 10 is a quadrangular shape having four sides parallel to the four sides of the substrate 2 at a planar view, and a corner portion facing a side surface of the cutout portion 6A of the semiconductor laminate structure portion 6 is formed to have a curved surface which protrudes outward. The n-side transparent electrode layer 10 is made of material (e.g., ITO or ZnO) transparent to the emission wavelength λ of the light emitting layer 4, for example. The n-side pad 11 is a circular shape at a planar view. The n-side pad 11 is made of Cr or Au, for example.

The light emitting layer 4 is laminated on the n-type semiconductor layer 3. The light emitting layer 4 covers a substantially whole area of the higher position region on the surface 3A of the n-type semiconductor layer 3. In this preferred embodiment, the light emitting layer 4 is made of a nitride semiconductor (e.g., InGaN) including In.

The p-type semiconductor layer 5 is laminated on the light emitting layer 4. The p-type semiconductor layer 5 covers a substantially whole area of a surface of the light emitting layer 4. The p-type semiconductor layer 5 is made of p-type GaN, and is transparent to the emission wavelength λ of the light emitting layer 4. A light emitting diode structure (semiconductor laminate structure portion 6) having the light emitting layer 4 sandwiched between the n-type semiconductor layer 3 and the p-type semiconductor layer 5 is formed in such a manner.

On a surface of the p-type semiconductor layer 5 on a side opposite to the light emitting layer 4, an insulating film 12, which is a circular shape at a planar view, is formed at a position close to a corner facing the cutout portion 6A of the semiconductor laminate structure portion 6. The insulating film 12 is made of $SiO_2$, for example.

A p-side transparent electrode layer 14 is formed on a surface of the p-type semiconductor layer 5. The p-side transparent electrode layer 14 covers a substantially whole area of a predetermined current injection region 13 (region of the current injection region 13 excluding second portions 16B of concave portions 16 which will be described later) on a surface of the p-type semiconductor layer 5. In this preferred embodiment, the current injection region 13 is set at a region on a surface of the p-type semiconductor layer 5 excluding the peripheral portion. A region on a surface of the p-type semiconductor layer 5 where the insulating film 12 is formed is included in the current injection region 13, and the insulating film 12 is covered with the p-side transparent electrode layer 14. The p-side transparent electrode layer 14 is made of material (e.g., ITO or ZnO) transparent to the emission wavelength λ, of the light emitting layer 4, for example. The p-side transparent electrode layer 14 has a thickness of approximately 100 nm to 300 nm, for example.

On a surface of the p-side transparent electrode layer 14 on a side opposite to the p-type semiconductor layer 5, a p-side electrode (p-side pad) 15 is formed at a position facing a surface of the insulating film 12 (position right above the insulating film 12 in FIG. 2). The p-side electrode 15 is a circular shape having a diameter smaller than the insulating film 12 at a planar view. The p-side electrode 15 is made of Cr or Au, for example. As is well known, the aforementioned insulating film 12 is provided in order to let electric current flow to a portion of the semiconductor laminate structure portion 6 excluding a portion right below the p-side electrode 15 and reduce light interrupted by the p-side electrode 15.

A plurality of concave portions 16, which penetrate the p-side transparent electrode layer 14 and enter the semiconductor laminate structure portion 6, are formed on a surface of the p-side transparent electrode layer 14 on aside opposite to the p-type semiconductor layer 5. An insulating film 17 made of $SiO_2$ is formed on an inner wall surface (bottom surface and inner circumferential surface) of each concave portion 16. In this preferred embodiment, each concave portion 16 extends from a surface of the p-side transparent electrode layer 14 up to inside of the n-type semiconductor layer 3. Each concave portion 16 is composed of a first portion (through hole) 16A, which penetrates the p-side transparent electrode layer 14, and a second portion (concave portion) 16B, which communicates with the first portion 16A and enters the semiconductor laminate structure portion 6.

Figure 4A:
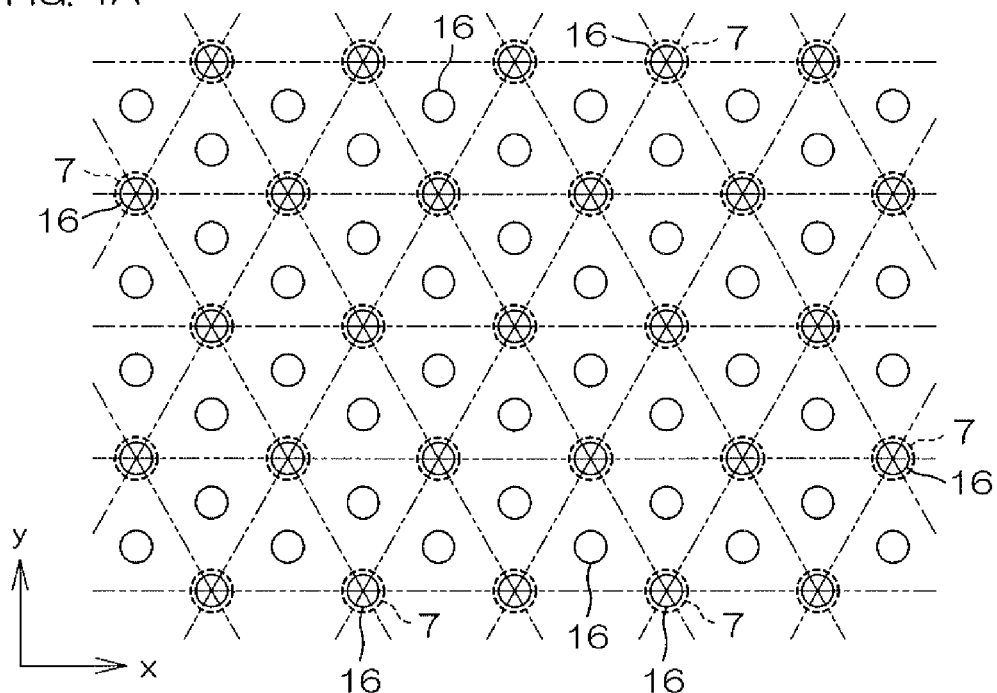
FIG. 4A is a schematic plan view illustrating an example of an arrangement pattern of concave portions in a case where the convex portions are arranged in the arrangement pattern in FIG. 3A.

The concave portions 16 are arranged discretely as illustrated in FIG. 4A. In this preferred embodiment, the concave portions 16 are formed at positions right above the centers of the respective convex portions 7 formed on the substrate 2 (positions facing the respective convex portions 7) and at positions right above the central positions of three two-dimensionally adjacent convex portions 7 (positions facing central positions of three two-dimensionally adjacent convex portions 7) among the plurality of convex portions 7. In a case where convex portions 7 are arranged at the respective vertexes of six regular triangles which compose each regular hexagon in aggregate of regular hexagons as illustrated in FIG. 4A, the respective centers of gravity of the respective regular triangles become central positions of three two-dimensionally adjacent convex portions 7. Accordingly, in such a case, the concave portions 16 are arranged at the respective vertexes and the respective centers of gravity of six regular triangles which compose each regular hexagon.

The concave portions 16 may be arranged only at positions right above the centers of the convex portions 7 formed on the substrate 2. That is, the concave portions 16 may be arranged only at the respective vertexes of six regular triangles which compose each regular hexagon illustrated in FIG. 4A.

The concave portions 16 may be formed only at positions right above the central positions of three two-dimensionally adjacent convex portions 7 among the plurality of convex portions 7 formed on the substrate 2. That is, the concave portions 16 may be arranged only at the respective centers of gravity of six regular triangles which compose each regular hexagon illustrated in FIG. 4A.

Figure 4B:
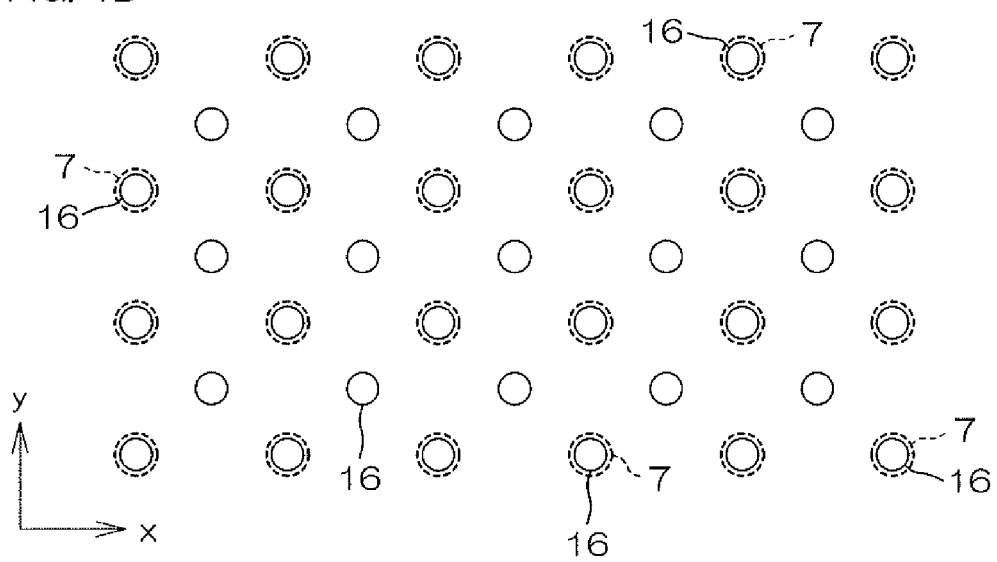
FIG. 4B is a schematic plan view illustrating an example of an arrangement pattern of concave portions in a case where the convex portions are arranged in the arrangement pattern in FIG. 3B.

In a case where the convex portions 7 are arranged in a matrix as illustrated in FIG. 3B, the plurality of concave portions 16 may be arranged at positions right above the centers of the respective convex portions 7 (positions facing the respective convex portions 7) at a planar view and at central positions of four two-dimensionally adjacent convex portions 7 as illustrated in FIG. 4B.

In a case where the convex portions 7 are arranged in a matrix as illustrated in FIG. 3B, the plurality of concave portions 16 may be arranged only at positions right above the centers of the respective convex portions 7 at a planar view, or may be arranged only at positions right above the central positions of four two-dimensionally adjacent convex portions 7.

Figure 5A:
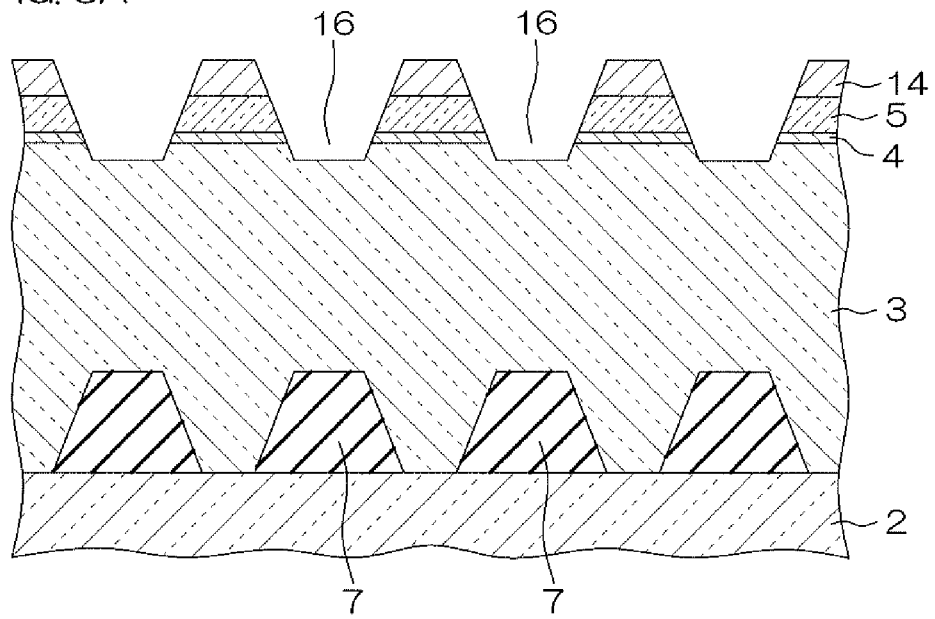
FIG. 5A is a schematic sectional view illustrating an example of the shape of a concave portion.

In this preferred embodiment, each concave portion 16 is a circular shape at a planar view. Moreover, in this preferred embodiment, each concave portion 16 has a downward-narrowing shape, in which the area of a transverse section at a lower position becomes smaller, as illustrated in FIG. 5A. Accordingly, a side surface of an inner wall surface (inner circumferential surface) of a concave portion 16 becomes an inclined plane which is inclined with respect to the surface 2A of the substrate 2.

Figure 5B:
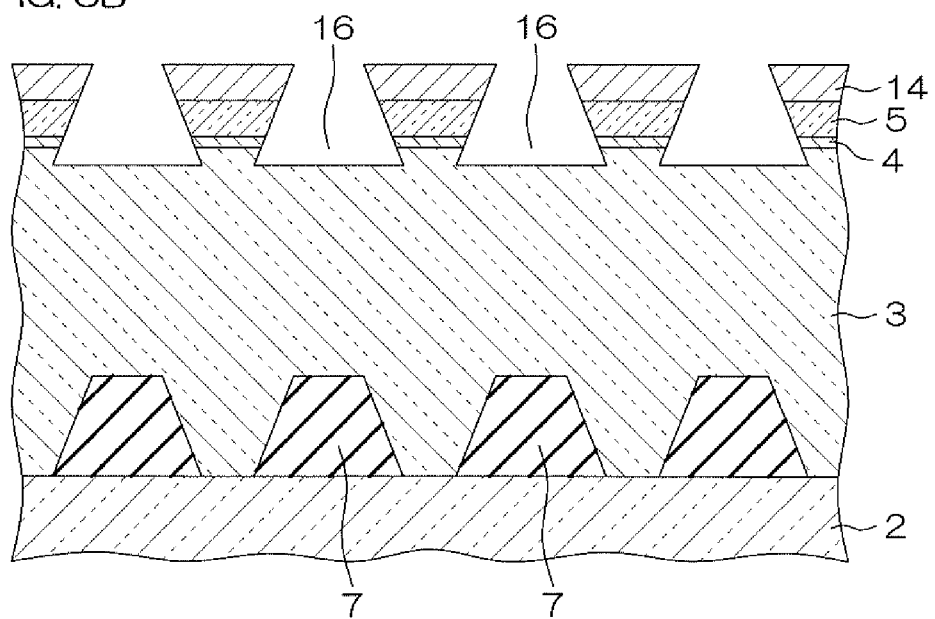
FIG. 5B is a schematic sectional view illustrating another example of the shape of a concave portion.

Each concave portion 16 may have a downward-widening shape, in which the area of a transverse section at a lower position becomes larger, as illustrated in FIG. 5B. In such a case, a side surface of an inner wall surface (inner circumferential surface) of a concave portion 16 also becomes an inclined plane which is inclined with respect to the surface 2A of the substrate 2.

FIGS. 6A to 6G are simulative sectional views illustrating a method for manufacturing the light emitting device illustrated in FIGS. 1 and 2.

Figure 6A:
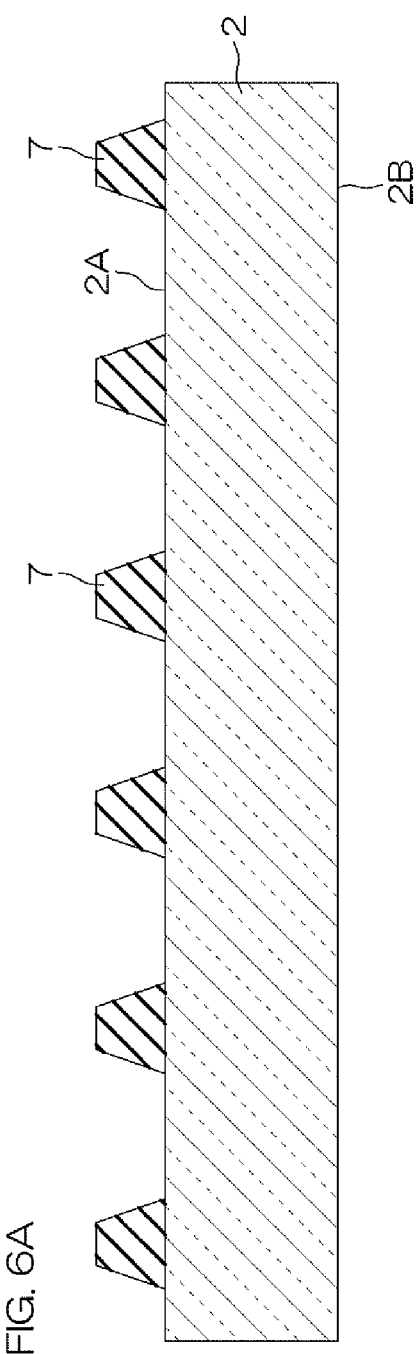
FIG. 6A is a schematic sectional view illustrating a method for manufacturing the light emitting device illustrated in FIGS. 1 and 2.
Figure 6B:
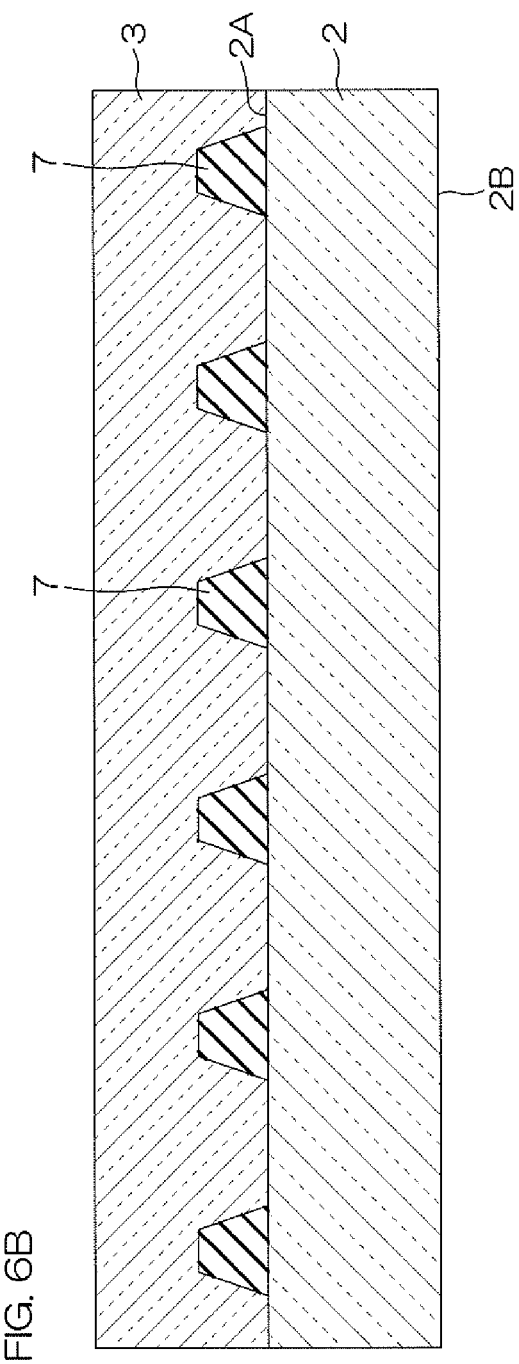
FIG. 6B is a schematic sectional view illustrating a process following FIG. 6A.

First, as illustrated in FIG. 6A, a layer (SiN) made of SiN is formed on the surface 2A of the substrate 2, and the SiN layer is separated into the plurality of convex portions 7 by etching which uses a resist pattern (illustration is omitted) as a mask. Next, as illustrated in FIG. 6B, a layer (n-GaN layer) made of n-type GaN is formed on the surface 2A of the substrate 2 so as to cover all convex portions 7. This forms the n-type semiconductor layer 3 on the surface 2A of the substrate 2.

Next, as illustrated in FIG. 6C, a nitride semiconductor (e.g., InGaN layer) including In is formed on a surface of the n-type semiconductor layer 3. This forms the light emitting layer 4 on a surface of the n-type semiconductor layer 3. The emission wavelength λ of the light emitting layer 4 is controlled to be 440 nm to 460 nm by adjusting the composition of In or Ga. Next, a layer (p-GaN layer) made of p-type GaN is formed on a surface of the light emitting layer 4. This forms the p-type semiconductor layer 5 on a surface of the light emitting layer 4.

Next, a resist pattern (illustration is omitted) having an opening at a region where the insulating film 12 is to be formed is formed on the p-type semiconductor layer 5. Then, as illustrated in FIG. 6D, the insulating film 12 made of $SiO_2$ is formed via the resist pattern by sputtering or plasma CVD, for example.

Figure 6E:
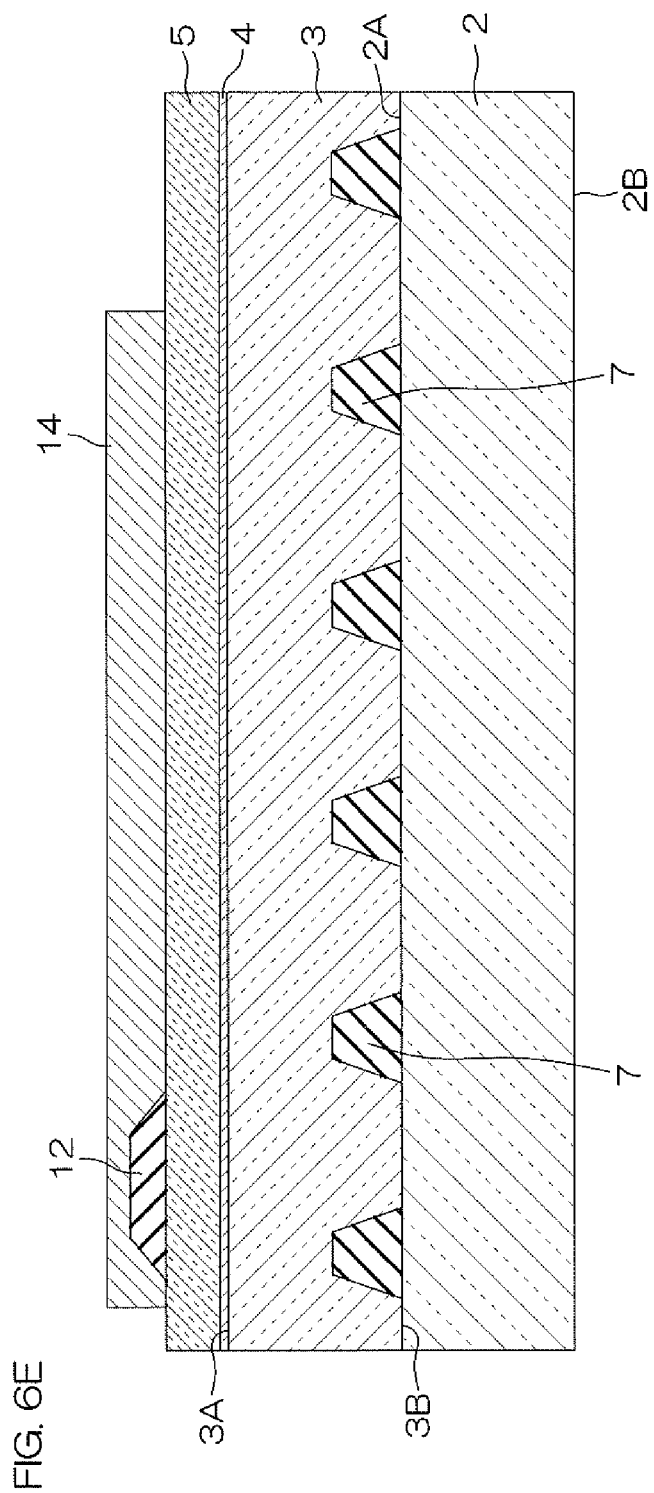
FIG. 6E is a schematic sectional view illustrating a process following FIG. 6D.

Next, a resist pattern (illustration is omitted) having an opening at a region (current injection region 13) where the p-side transparent electrode layer 14 is to be formed is formed on the p-type semiconductor layer 5. Then, a layer (ITO layer) made of ITO is stacked on the p-type semiconductor layer 5 via the resist pattern by sputtering, for example. Then, an unnecessary portion of ITO material is lifted off together with the resist pattern. This forms the p-side transparent electrode layer 14, which covers the insulating film 12, on a surface of the p-type semiconductor layer 5 as illustrated in FIG. 6E.

Figure 6F:
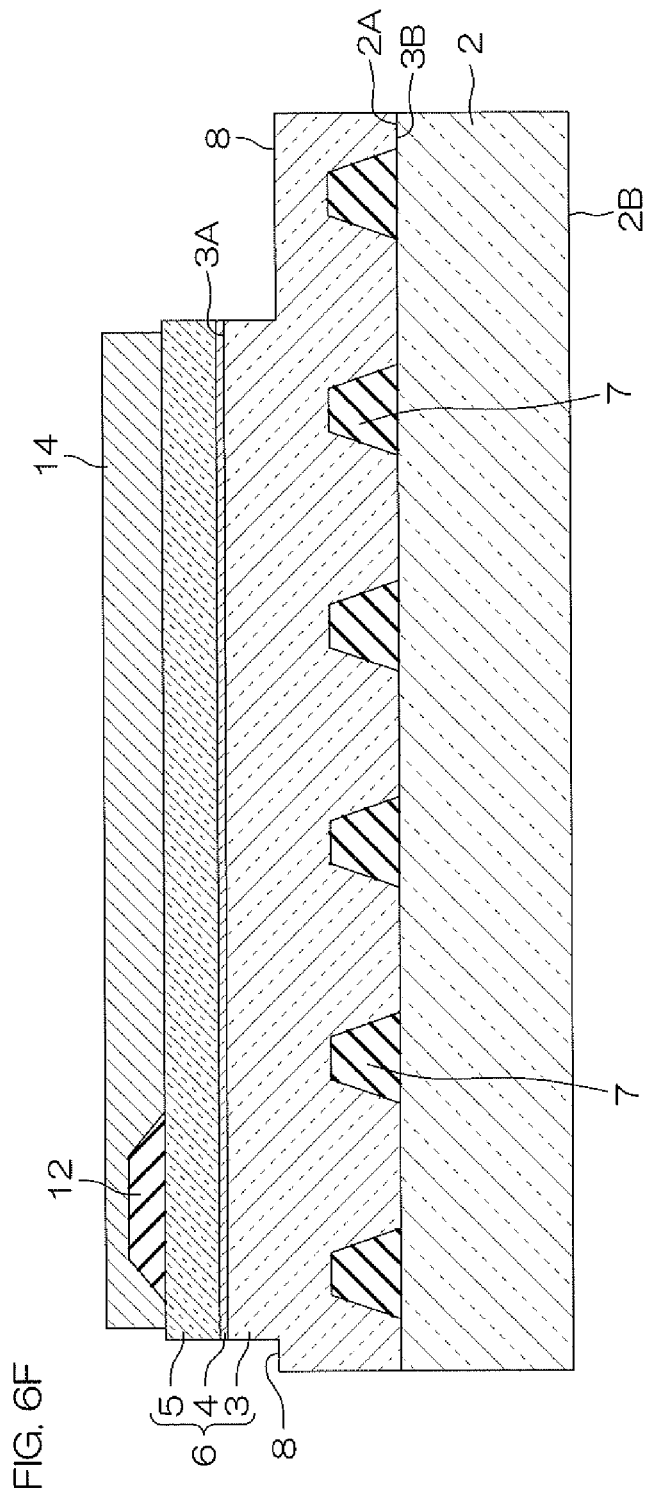
FIG. 6F is a schematic sectional view illustrating a process following FIG. 6E.

Next, as illustrated in FIG. 6F, the p-type semiconductor layer 5, the light emitting layer 4 and the n-type semiconductor layer 3 are respectively removed selectively by etching which uses a resist pattern (illustration is omitted) as a mask. This forms the semiconductor laminate structure portion 6 and the lead portion 8, which is extended from the semiconductor laminate structure portion 6.

Figure 6G:
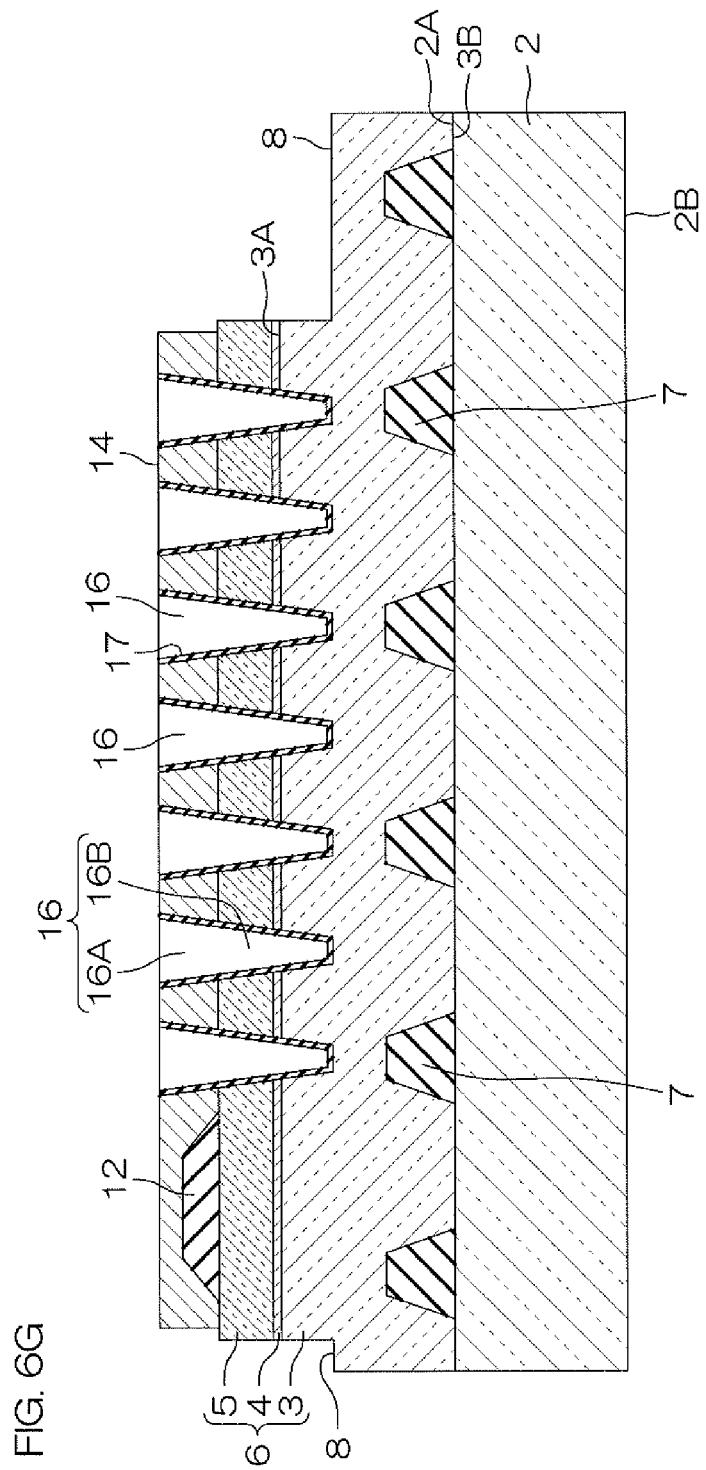
FIG. 6G is a schematic sectional view illustrating a process following FIG. 6F.

Next, a resist pattern (illustration is omitted) having openings at regions where the concave portions 16 are to be formed is formed on the p-side transparent electrode layer 14. Then, as illustrated in FIG. 6G, the concave portions 16 are formed via the resist pattern by etching the p-side transparent electrode layer 14, the p-type semiconductor layer 5, the light emitting layer 4 and the n-type semiconductor layer 3. Next, in a state where the resist pattern is left, a $SiO_2$ layer is formed on the inner wall surface of the concave portions 16 and on the resist pattern. Then, an unnecessary portion of the $SiO_2$ layer is lifted off together with the resist pattern. This forms the insulating film 17 made of $SiO_2$ on the inner wall surface (bottom surface and side surface) of the concave portions 16.

Thereafter, the n-side electrode 9 is formed on a surface of the lead portion 8 (n-type semiconductor layer 3), and the p-side electrode 15 is formed in a region on a surface of the p-side transparent electrode layer 14 right above the insulating film 12. This provides the light emitting device illustrated in FIGS. 1 and 2.

In such a light emitting device 1, electric current flows from the p-side electrode 15 toward the n-side electrode 9 when forward voltage is applied across the n-side electrode 9 (n-side pad 11) and the p-side electrode (p-side pad) 15. Electric current flows from the p-side electrode 15 through the p-side transparent electrode layer 14, the p-type semiconductor layer 5, the light emitting layer 4 and the n-type semiconductor layer 3 in this order toward the n-side electrode 9. As electric current flows in such a manner, electrons are injected from the n-type semiconductor layer 3 to the light emitting layer 4, and holes are injected from the p-type semiconductor layer 5 to the light emitting layer 4. Then, the holes and electrons recombine in the light emitting layer 4, so that light having a wavelength of 440 nm to 460 nm is generated from the light emitting layer 4. The light is transmitted through the p-type semiconductor layer 5 and the p-side transparent electrode layer 14 and is extracted from a surface of the p-side transparent electrode layer 14.

Light, which travels from the light emitting layer 4 toward the n-type semiconductor layer 3 side, is transmitted through the n-type semiconductor layer 3. Then, part of the light is reflected at the interface between the n-type semiconductor layer 3 and the substrate 2, at the rear surface of the substrate 2, or the like. Reflected light is transmitted through the n-type semiconductor layer 3, the light emitting layer 4, the p-type semiconductor layer 5 and the p-side transparent electrode layer 14 in this order and is extracted from a surface of the p-side transparent electrode layer 14.

In this preferred embodiment, a plurality of concave portions 16, which penetrate the p-side transparent electrode layer 14 from a surface of the p-side transparent electrode layer 14 and enter the semiconductor laminate structure portion 6, are formed. This reflects light, which is propagated in the semiconductor laminate structure portion 6, at a side surface of the inner wall surface of the concave portions 16 and extracts light to the p-side transparent electrode layer 14 side, and therefore the light extraction efficiency can be improved. Especially, in this preferred embodiment, the concave portions 16 have the second portions 16B which enter the semiconductor laminate structure portion 6, and therefore the light extraction efficiency can be improved in comparison with a case where concave portions are formed only in the p-side transparent electrode layer 14.

Moreover, in this preferred embodiment, the concave portions 16 extend up to the n-type semiconductor layer 3. As the depth of the concave portions 16 becomes larger, the area of a side surface of the inner wall surface of the concave portions 16 becomes larger, and therefore the light extraction efficiency can be improved in comparison with a case where the concave portions 16 do not extend up to the n-type semiconductor layer 3. In a case where the concave portions 16 are formed to extend up to the n-type semiconductor layer 3, the concave portions 16 penetrate the light emitting layer 4, and therefore the area of the light emitting layer 4 decreases. However, the concave portions 16 can extract light from the light emitting layer 4 before light generated in the light emitting layer 4 is absorbed in the light emitting layer 4, and therefore the light extraction efficiency can be improved.

Moreover, in this preferred embodiment, a plurality of convex portions 7 are formed on the surface 2A of the substrate 2, and therefore the light extraction efficiency can be improved.

In a case where a plurality of convex portions 7 are formed on the surface 2A of the substrate 2, since lateral growth joins crystal growth of the n-type semiconductor layer 3 on the substrate 2 in regions in the n-type semiconductor layer 3 right above the centers of the convex portions 7, a defect portion is likely to occur in the regions. Moreover, defect of the substrate 2 is likely to be taken over and a defect portion is likely to occur in a region in the n-type semiconductor layer 3 right above a central position of a plurality of two-dimensionally adjacent convex portions 7 among the plurality of convex portions 7. In a case where a defect portion exists in the n-type semiconductor layer 3, the resistance value of the defect portion is low, and therefore electric current flows to the defect portion in a concentrated manner and the light emitting device 1 may possibly be broken.

In this preferred embodiment, the concave portions 16 are arranged at positions right above the central positions of the respective convex portions 7, and concave portions 16 are arranged at positions right above the central positions of a plurality of two-dimensionally adjacent convex portions 7 among the plurality of convex portions 7. That is, the concave portions 16 are arranged right above the portions in the n-type semiconductor layer 3 where a defect portion is likely to occur. This makes it difficult for electric current from the p-side transparent electrode layer 14 to flow to a portion in the n-type semiconductor layer 3 where a defect portion is likely to occur. This can suppress concentrated flow of electric current to the defect portion, and therefore reliability of the light emitting device 1 can be improved. Furthermore, in this preferred embodiment, the insulating film 17 is formed on the inner wall surface of the concave portions 16, and therefore it becomes more difficult for electric current to flow to a portion where a defect portion is likely to occur and reliability of the light emitting device 1 can be further improved.

The effect to suppress concentrated flow of electric current to a defect portion can be achieved even in a case where the concave portions 16 are constituted only of the second portions 16B. That is, although no concave portion is formed in the p-side transparent electrode layer 14, the effect to suppress concentrated flow of electric current to the defect portion is obtained as long as concave portions are formed on a surface of the semiconductor laminate structure portion 6.

Figure 7:
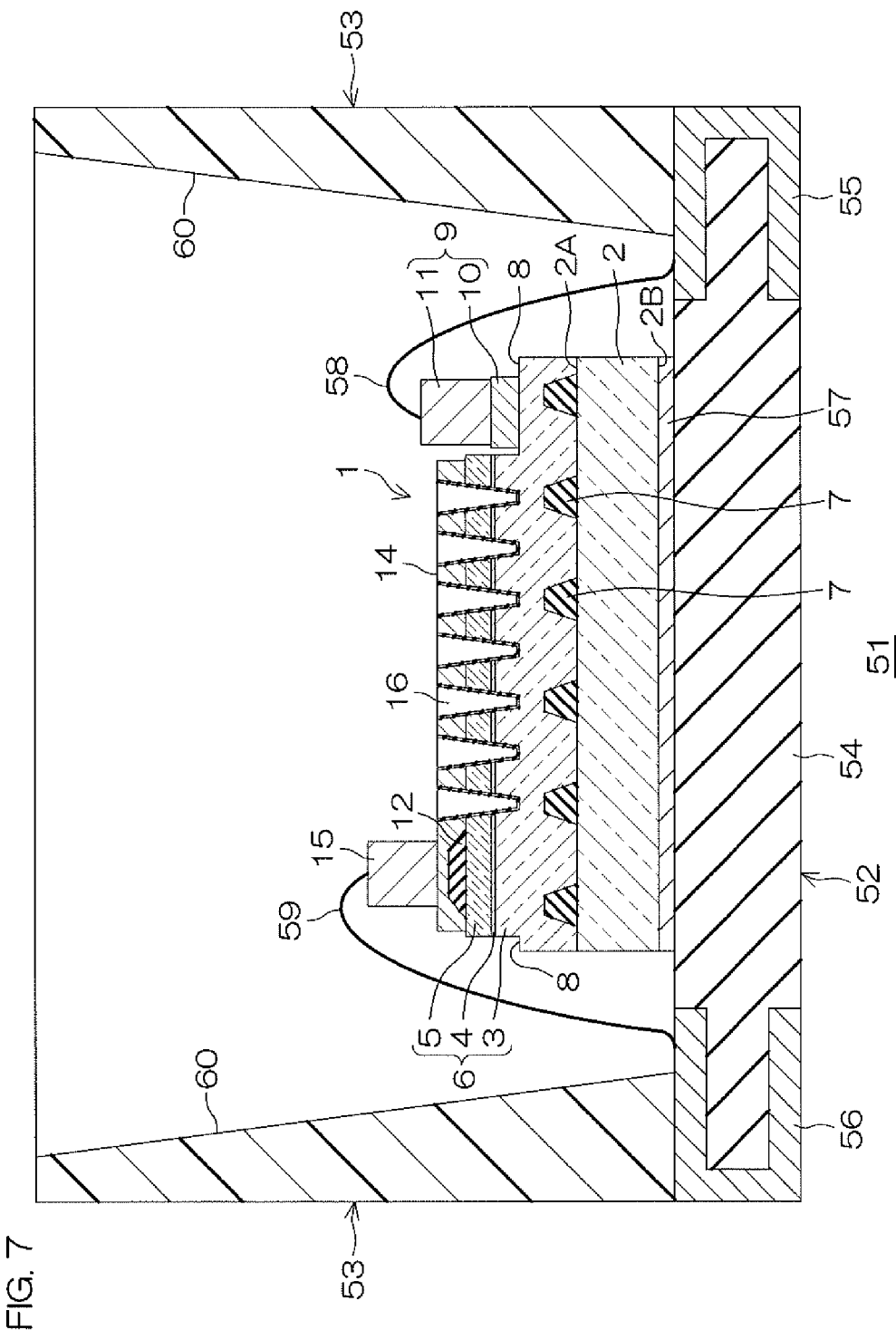
FIG. 7 is a schematic sectional view of a light emitting device package.

FIG. 7 is a schematic sectional view of a light emitting device package.

A light emitting device package 51 includes the light emitting device 1, a support substrate 52 and a resin package 53. The support substrate 52 is provided with an insulating substrate 54 arranged to support the light emitting device 1, and a pair of electrodes 55 and 56 which are provided to be exposed from both ends of the insulating substrate 54.

The light emitting device 1 is supported by the support substrate 52 at an attitude in which the surface 2A of the substrate 2 faces upward. Specifically, the rear surface 2B of the substrate 2 in the light emitting device 1 is bonded with the insulating substrate 54 via an adhesive layer 57. That is, the light emitting device 1 is mounted face up. The n-side electrode 9 (n-side pad 11) of the light emitting device 1 and one electrode 55 are connected with each other via a wire 58. The p-side electrode 15 of the light emitting device 1 and the other electrode 56 are connected with each other via a wire 59.

The resin package 53 is a case filled with resin, and is fixed to the support substrate 52 with the light emitting device 1 accommodated therein (covered therewith) and protected. The resin package 53 has a reflector 60, which is arranged to reflect light emitted from the light emitting device 1 and extract the light, on a lateral surface (portion facing the light emitting device 1). The reflector 60 is made of resin, for example.

Some resins to constitute the resin package 53 contain fluorescent material or a reflecting agent. For example, in a case where the light emitting device 1 emits blue light, the light emitting device package 51 can emit white light when the resin contains yellow fluorescent material. Assembly of a number of light emitting device packages 51 can be used for lighting equipment such as an electric bulb, and also can be used for a backlight of a liquid crystal television or for a headlamp of an automobile or the like.

In such a light emitting device package 51, light emitted in the light emitting layer 4 of the light emitting device 1 is immediately transmitted through the p-type semiconductor layer 5 and emitted from a surface of the p-side transparent electrode layer 14, or is transmitted through the n-type semiconductor layer 3 and reflected once at the rear surface 2B of the substrate 2 or the like and is then emitted from a surface of the p-side transparent electrode layer 14.

In view of a light emitting device package illustrated in FIG. 7, the light emission quantity in a plurality of virtual samples (which will be hereinafter referred to simply as "samples") S1 to S24 illustrated in Table 1 were calculated by simulation using ray tracing.

TABLE 1

| | Existence and Shape of Concave Portion and Convex Portion | | | | |
|---|---|---|---|---|---|
| | | | Upper | Upper Concave | |
| | Base | Upper | Concave | Portion Shift | |
| | Convex | Concave | portion | Amount [µm] | |
| Sample | portion | portion | Shape | Δx | Δy |
| S1 | Nonexistence | Nonexistence | — | — | — |
| S2 | Existence | Nonexistence | — | — | — |
| S3 | Nonexistence | Existence | Shape A | — | — |
| S4 | Nonexistence | Existence | Shape B | — | — |
| S5 | Existence | Existence | Shape A | 0 | 0 |
| S6 | | | | L/4 | 0 |
| S7 | | | | L/2 | 0 |
| S8 | | | | 0 | H/4 |
| S9 | | | | 0 | H/2 |
| S10 | | | | L/4 | H/4 |
| S11 | | | | L/4 | H/2 |
| S12 | | | | L/2 | H/4 |
| S13 | | | | L/2 | H/2 |
| S14 | | | | L/2 | H/3 |
| S15 | Existence | Existence | Shape B | 0 | 0 |
| S16 | | | | L/4 | 0 |
| S17 | | | | L/2 | 0 |
| S18 | | | | 0 | H/4 |
| S19 | | | | 0 | H/2 |
| S20 | | | | L/4 | H/4 |
| S21 | | | | L/4 | H/2 |
| S22 | | | | L/2 | H/4 |
| S23 | | | | L/2 | H/2 |
| S24 | | | | L/2 | H/3 |

In Table 1, "Base Convex Portion" denotes convex portions 7 formed on the surface 2A of the substrate 2. "Upper Concave Portion" denotes concave portions 16 which extend from a surface of the p-side transparent electrode layer 15 up to inside of the semiconductor laminate structure portion 6. "Upper Concave Portion Shape" denotes the shape of concave portions 16. A downward-narrowing shape illustrated in FIG. 5A is denoted as "Shape A," while a downward-widening shape illustrated in FIG. 5B is denoted as "Shape B." The definition of "Upper Concave Portion Shift Amount" will be described later.

Samples S1 to S24 respectively have a basic structure similar to the aforementioned light emitting device 1 but have structures different from the light emitting device 1. Samples S1 and S2 respectively are comparative examples, while samples S3 to S24 are examples.

First, samples S5 to S24 among samples S3 to S24 as examples will be described. Samples S5 to S24 have convex portions 7 and concave portions 16. Here, an entire pattern of the concave portions 16 and positions of the concave portions 16 with respect to the convex portions 7 are different from the aforementioned light emitting device 1. Moreover, the shape of concave portions in samples S5 to S14 is "Shape A," and the shape of concave portions in samples S15 to S24 is "Shape B."

The entire pattern of concave portions 16 in samples S5 to S24 will be described. Convex portions 7 on the surface of the substrate 2 are arranged in the pattern illustrated in FIG. 3A. The entire pattern of the concave portions 16 is the same as the entire pattern of the convex portions 7. Between samples S5 to S14 and between samples S15 to S24, the positions of the concave portions 16 with respect to the convex portions 7 are different.

The positions of the concave portions 16 with respect to the convex portions 7 were changed by slightly shifting the positions of the respective concave portions 16 with respect to corresponding convex portions 7 from a state where the respective concave portions 16 are arranged right above the central positions of the respective convex portions 7 to a state where the respective concave portions 16 are arranged right above the central positions of three two-dimensionally adjacent convex portions 7 (positions of centers of gravity of the respective triangles in FIG. 3A). The shift amount of positions of the concave portions 16 with respect to the convex portions 7 is different between samples S5 to S14 and between samples S15 to S24.

Figure 8:
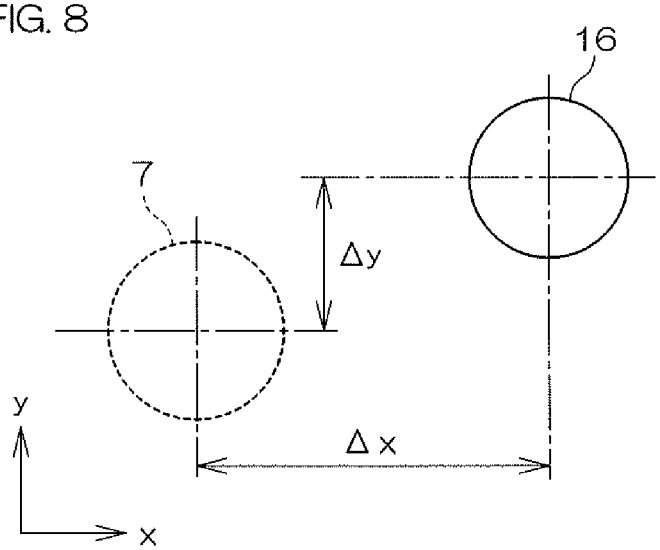
FIG. 8 is a schematic plan view for explaining an x-direction shift amount $\Delta x$ and a y-direction shift amount $\Delta y$.

The shift amount of positions of the concave portions 16 with respect to the convex portions 7 is "Upper Concave Portion Shift Amount" in Table 1. "Upper Concave Portion Shift Amount" includes an x-direction shift amount and a y-direction shift amount. As illustrated in FIG. 8, a shift amount (distance between center points) Δx in the x-direction (the same as the x-direction in FIG. 3A) of the concave portions 16 with respect to the convex portions 7 is defined as an x-direction shift amount, while a shift amount (distance between center points) Δy in the y-direction (the same as the y-direction in FIG. 3A) is defined as a y-direction shift amount.

"L" and "H" used in "Upper Concave Portion Shift Amount" in Table 1 are defined as follows. In FIG. 3A, the length of one side of six regular triangles which compose a hexagon is defined as L [µm], and the height of the regular triangles is defined as H [µm].

For example, in samples S5 and S15, the concave portions 16 are arranged only at positions right above the centers of the respective convex portions 7 (Δx=Δy=0). For another example, in samples S14 and S24, the concave portions 18 are arranged only at positions right above the central positions of three two-dimensionally adjacent convex portions 7 (Δx=L/2, Δy=H/3).

Sample S1 as a comparison example is a light emitting device where no convex portion 7 exists and no concave portion 16 exists in contrast to the light emitting device 1. Sample S2 as a comparison example is a light emitting device where a convex portion 7 exists but no concave portion 16 exists in contrast to the light emitting device 1.

Sample S3 as an example is a light emitting device where no convex portion 7 exists but a concave portion 16 does exist. Here, the pattern, the shape and the size of the concave portion 16 in sample S3 is the same as aforementioned sample S5. Sample S4 as an example is a light emitting device where no convex portion 7 exists but a concave portion 16 does exist. Here, the pattern, the shape and the size of the concave portion 16 in sample S4 is the same as aforementioned sample S15.

Figure 9:
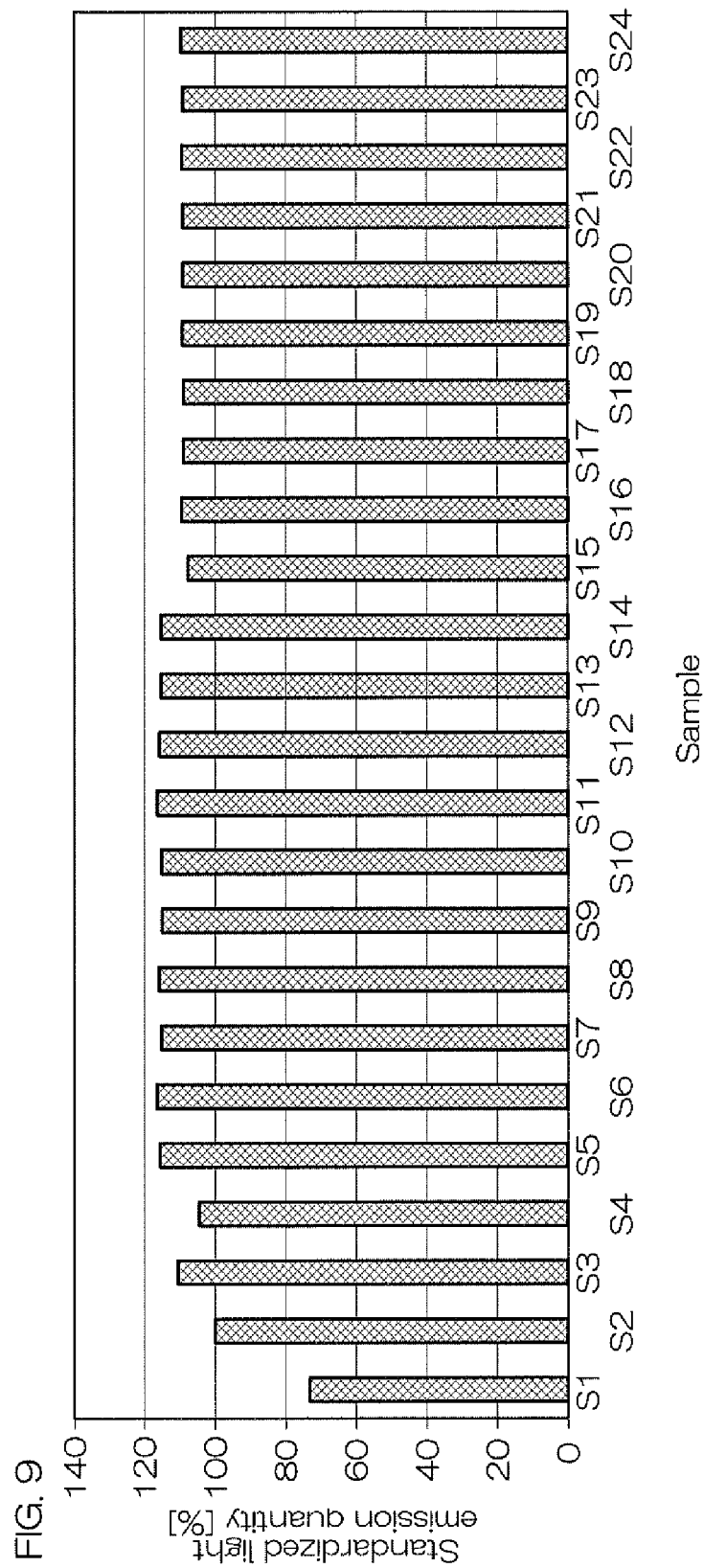
FIG. 9 is a graph illustrating a simulation result.

FIG. 9 is a graph illustrating a simulation result. In FIG. 9, the standardized light emission quantity [%] obtained by standardizing the light emission quantity of the respective samples S1 to S24 with respect to the light emission quantity of sample S2 as 100% is represented in a bar graph.

It is clear from FIG. 9 that the light emission quantity of samples S3 and S4 is larger than the light emission quantity of samples S1 and S2. That is, the light emission quantity (light emission luminance) of a light emitting device where no convex portion 7 exists but a concave portion 16 does exist can be larger than a light emitting device where no convex portion 7 exists and no concave portion 16 exists, or a light emitting device where a convex portion 7 exists but no concave portion 16 exists.

It is also clear from FIG. 9 that the light emission quantity of samples S5 to S14 is larger than the light emission quantity of sample S3. Similarly, it is clear that the light emission quantity of samples S15 to S24 is larger than the light emission quantity of sample S4. That is, in a case where the shape of the concave portion 16 is the same, the light emission quantity (light emission luminance) of a light emitting device where both of a concave portion 16 and a convex portion 7 exist can be larger than a light emitting device where only a concave portion 16 of a concave portion 16 and a convex portion 7 exists.

In addition, a defect portion in the n-type semiconductor layer 3 is not taken into account in this simulation, and therefore the influence of the effect to suppress flow of electric current to the defect portion due to the arrangement positions of the concave portions 16 is not reflected to the simulation result.

Figure 10:
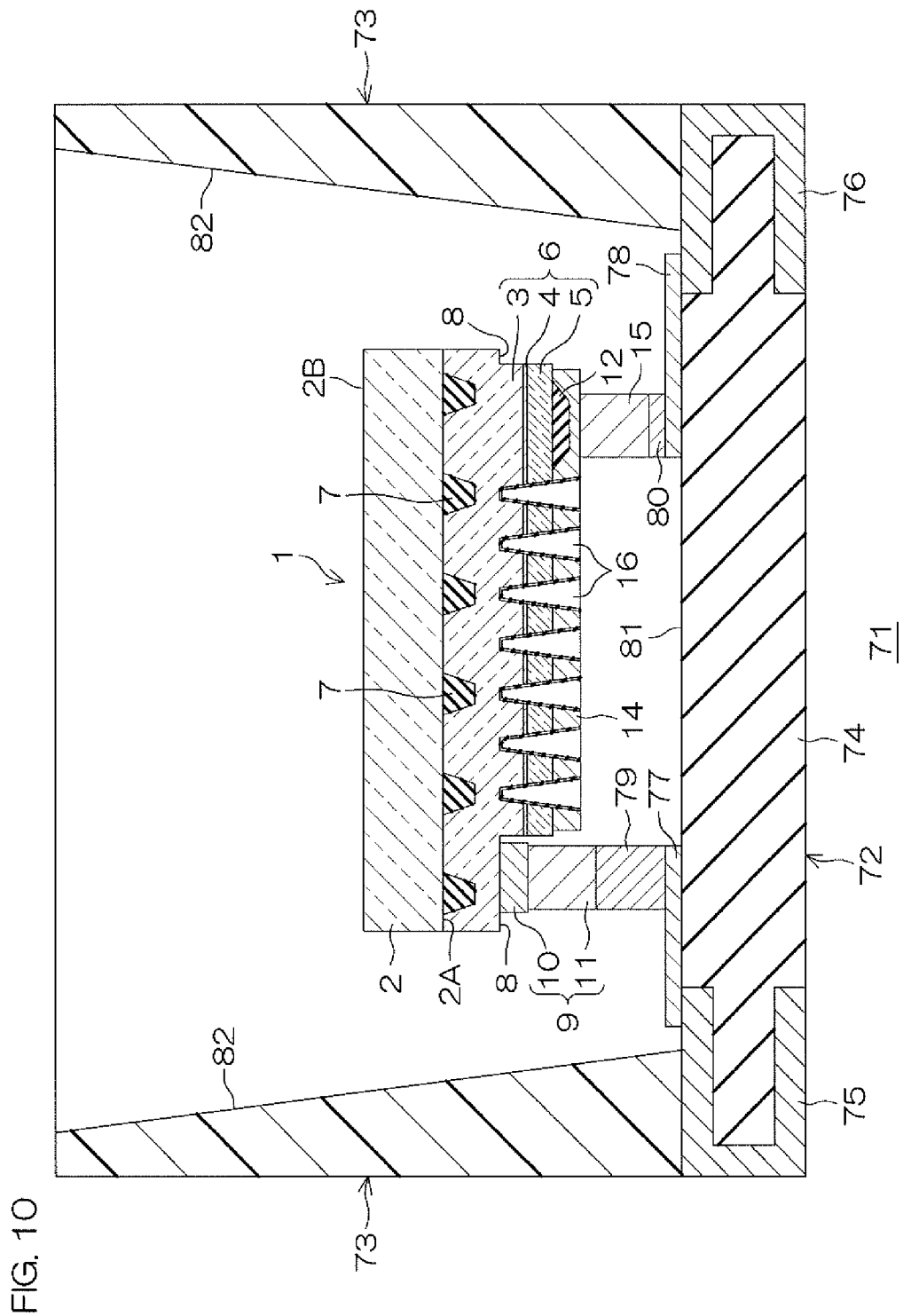
FIG. 10 is a schematic sectional view illustrating another example of a light emitting device package.

FIG. 10 is a schematic sectional view illustrating another example of a light emitting device package.

Alight emitting device package 71 includes the light emitting device 1, a support substrate 72 and a resin package 73. The support substrate 72 is provided with an insulating substrate 74 arranged to support the light emitting device 1, a pair of electrodes 75 and 76 which are provided to be exposed from both ends of the insulating substrate 74, an n-side electrode layer 77 and a p-side electrode layer 78 which are formed on a surface of the insulating substrate 74 in the resin package 73, and an n-side junction layer 79 and a p-side junction layer 80 which are formed respectively on a surface of the n-side electrode layer 77 and a surface of the p-side electrode layer 78. The n-side electrode layer 77 is connected with one electrode 75. The p-side electrode layer 78 is connected with the other electrode 76.

The light emitting device 1 is supported by the support substrate 72 at an attitude in which the surface 2A of the substrate 2 faces downward. Specifically, a surface of the n-side electrode 9 (n-side pad 11) of the light emitting device 1 is bonded with the n-side junction layer 79, and a surface of the p-side electrode 15 of the light emitting device 1 is bonded with the p-side junction layer 80. That is, the light emitting device 1 is mounted face down. A reflector 81 arranged to reflect light transmitted through the p-side transparent electrode layer 14 of the light emitting device 1 is formed at a required position on a surface of the insulating substrate 74. The reflector 81 is made of resin, for example.

The resin package 73 is a case filled with resin, and is fixed to the support substrate 72 with the light emitting device 1 accommodated therein (covered therewith) and protected. The resin package 73 has a reflector 82, which is arranged to reflect light emitted from the light emitting device 1 and extract the light, on a lateral surface (portion facing the light emitting device 1). The reflector 82 is made of resin, for example.

In such a light emitting device package 71, light emitted from the light emitting layer 4 of the light emitting device 1 is immediately transmitted through the n-type semiconductor layer 3 and emitted from the rear surface 2B of the substrate 2, or is transmitted through the p-type semiconductor layer 5 and the p-side transparent electrode layer 14 and reflected at the reflector 81 and is then emitted from the rear surface 2B of the substrate 2.

Although the above description has explained a preferred embodiment of the first invention, the first invention can be further implemented in another preferred embodiment. Although the concave portions 16 in the above preferred embodiment extend from a surface of the p-side transparent electrode layer 14 up to inside of the n-type semiconductor layer 3, concave portions 16 may extend from a surface of the p-side transparent electrode layer 14 up to inside of the p-type semiconductor layer 5 (not up to the light emitting layer 4). Moreover, concave portions 16 may be constituted only of second portions 16B formed on a surface of the semiconductor laminate structure portion 6 (surface of the p-type semiconductor layer 5). That is, concave portions 16 (first portions 16A) may not be formed in the p-side transparent electrode layer 14. In such a case, the whole area of the current injection region 13 on a surface of the p-type semiconductor layer 5 is covered with the p-side transparent electrode layer 14.

Moreover, although the concave portions 16 in the above preferred embodiment are formed in a circular shape at a planar view, concave portions 16 may be formed in a polygonal shape (quadrangular shape, hexagonal shape or the like) at a planar view.

Moreover, although GaN is illustrated as a nitride semiconductor which constitutes the n-type semiconductor layer 3 and the p-type semiconductor layer 5 in the above preferred embodiment, another nitride semiconductor such as aluminum nitride (AlN) or indium nitride (InN) may be used. A nitride semiconductor can be represented generally as $Al_xIn_yGa_{(1-x-y)}N$ ($0 \leq x \leq 1$, $0 \leq y \leq 1$, $0 \leq x+y \leq 1$). Moreover, the present invention may be applied to a light emitting device which is not provided with a nitride semiconductor but provided with another compound semiconductor such as GaAs or semiconductor material other than a compound semiconductor (e.g., diamond).

[2] Second Invention

The second invention has the following features.

A1. Alight emitting device including a substrate having a surface and a rear surface, a semiconductor laminate structure portion having an n-type semiconductor layer, alight emitting layer and a p-type semiconductor layer which are laminated in series on the surface of the substrate, a plurality of transparent insulating films which are formed discretely in a predetermined current injection region on a surface of the p-type semiconductor layer on aside opposite to the light emitting layer, a transparent electrode layer which is formed in the current injection region on a surface of the p-type semiconductor layer on a side opposite to the light emitting layer and covers the transparent insulating film, and a p-side electrode which is formed on a surface of the transparent electrode layer on aside opposite to the p-type semiconductor layer.

In such a structure, light which enters the transparent electrode layer from inside of the semiconductor laminate structure portion is reflected at a side surface of the transparent insulating film and is extracted from a surface of the transparent electrode layer on a side opposite to the p-type semiconductor layer, and therefore the light extraction efficiency can be improved.

A2. The light emitting device according to "A1," further including a lead portion which is electrically connected with the n-type semiconductor layer and is extended from the semiconductor laminate structure portion in a direction parallel to the substrate, and an n-side electrode formed on the lead portion.

A3. The light emitting device according to "A1" or "A2," wherein a plurality of convex portions covered with the n-type semiconductor layer are formed on the surface of the substrate, and the plurality of transparent insulating films include a transparent insulating film which is located to face a portion in the n-type semiconductor layer where a defect is likely to occur.

In such a structure, a plurality of convex portions are formed on the surface of the substrate, and therefore it is possible to suppress total reflection of light at the interface between the substrate and the n-type semiconductor layer. This can improve the light extraction efficiency.

Moreover, in such a structure, the plurality of transparent insulating films include a transparent insulating film which is located to face a portion in the n-type semiconductor layer where a defect is likely to occur. This makes it difficult for electric current from the transparent electrode side to flow to a portion in the n-type semiconductor layer where a defect portion is likely to occur. This can suppress concentrated flow of electric current to a defect portion in the n-type semiconductor layer, and therefore reliability of the light emitting device can be improved.

A4. The light emitting device according to "A3," wherein the plurality of transparent insulating films include a transparent insulating film which is located to face each of the plurality of convex portions.

In a case where a plurality of convex portions are formed on the surface of the substrate, since lateral growth joins crystal growth of the n-type semiconductor layer on the substrate in regions in the n-type semiconductor layer right above the centers of the convex portions, a defect portion is likely to occur in the regions. In such a structure, the plurality of transparent insulating films include a transparent insulating film which is located to face each convex portion. This makes it difficult for electric current from the transparent electrode side to flow to a portion in the n-type semiconductor layer where a defect portion is likely to occur. This can suppress concentrated flow of electric current to a defect portion in the n-type semiconductor layer, and therefore reliability of the light emitting device can be improved.

A5. The light emitting device according to "A3," wherein the plurality of transparent insulating films include a transparent insulating film which is located to face a central position of a plurality of two-dimensionally adjacent convex portions among the plurality of convex portions.

In a case where a plurality of convex portions are formed on the surface of the substrate, defect of the substrate is likely to be taken over and a defect portion is likely to occur in a region in the n-type semiconductor layer right above a central position of a plurality of two-dimensionally adjacent convex portions among the plurality of convex portions. In such a structure, the plurality of transparent insulating films include a transparent insulating film which is located to face a central position of a plurality of two-dimensionally adjacent convex portions among the plurality of convex portions. This makes it difficult for electric current from the transparent electrode side to flow to a portion in the n-type semiconductor layer where a defect portion is likely to occur. This can suppress concentrated flow of electric current to a defect portion in the n-type semiconductor layer, and therefore reliability of the light emitting device can be improved.

A6. The light emitting device according to any one of "A3" to "A5," wherein the convex portions are constituted of an insulating film formed on the surface of the substrate.

A7. The light emitting device according to any one of "A3" to "A5," wherein the convex portions are formed by etching the surface of the substrate.

A8. The light emitting device according to any one of "A1" to "A7," wherein the transparent insulating film has a thickness equal to or larger than 10 nm and equal to or smaller than 5 μm.

A9. The light emitting device according to any one of "A1" to "A8," wherein a current interruption insulating film is formed at a position, which faces the p-side electrode, on a surface of the p-type semiconductor layer on a side opposite to the light emitting layer, and the transparent insulating film is formed in the same process as the current interruption insulating film.

A preferred embodiment of the second invention will be described in detail with reference to the appended drawings.

Figure 11:
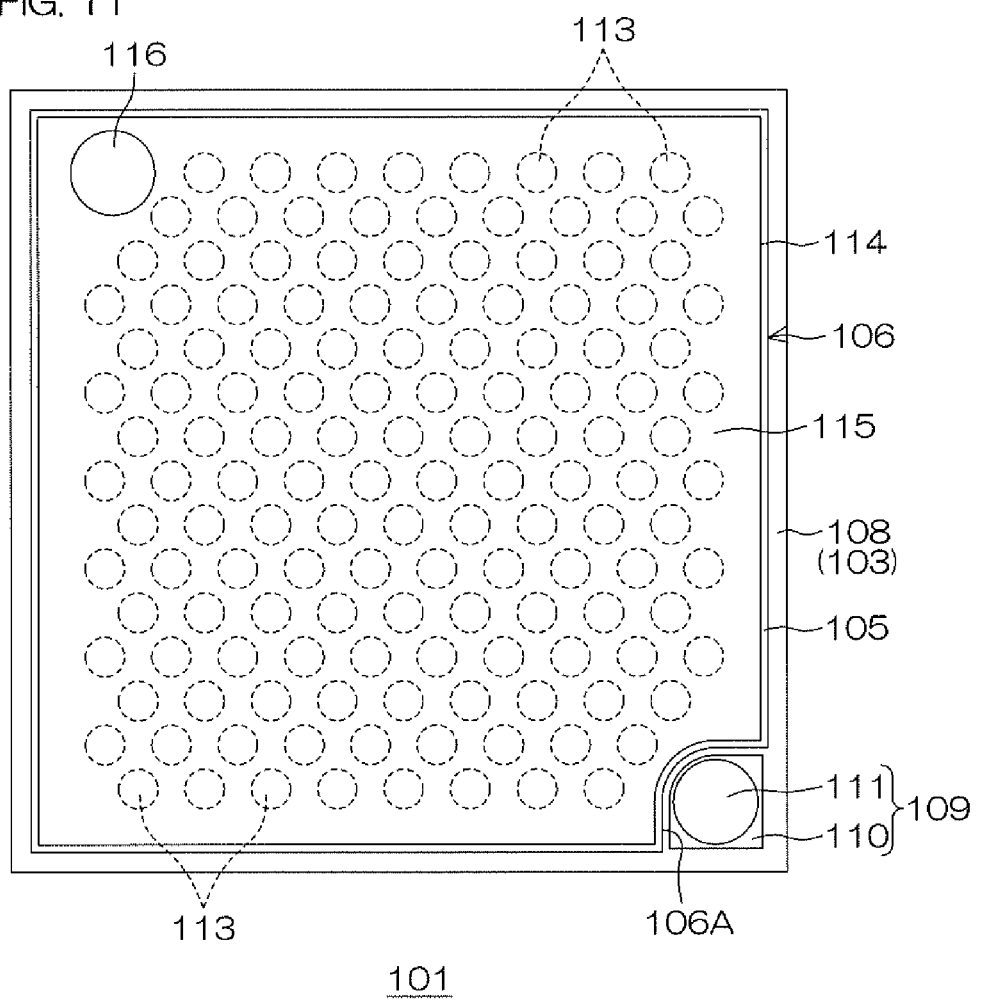
FIG. 11 is a schematic plan view of a light emitting device according to a preferred embodiment of a second invention.
Figure 12:
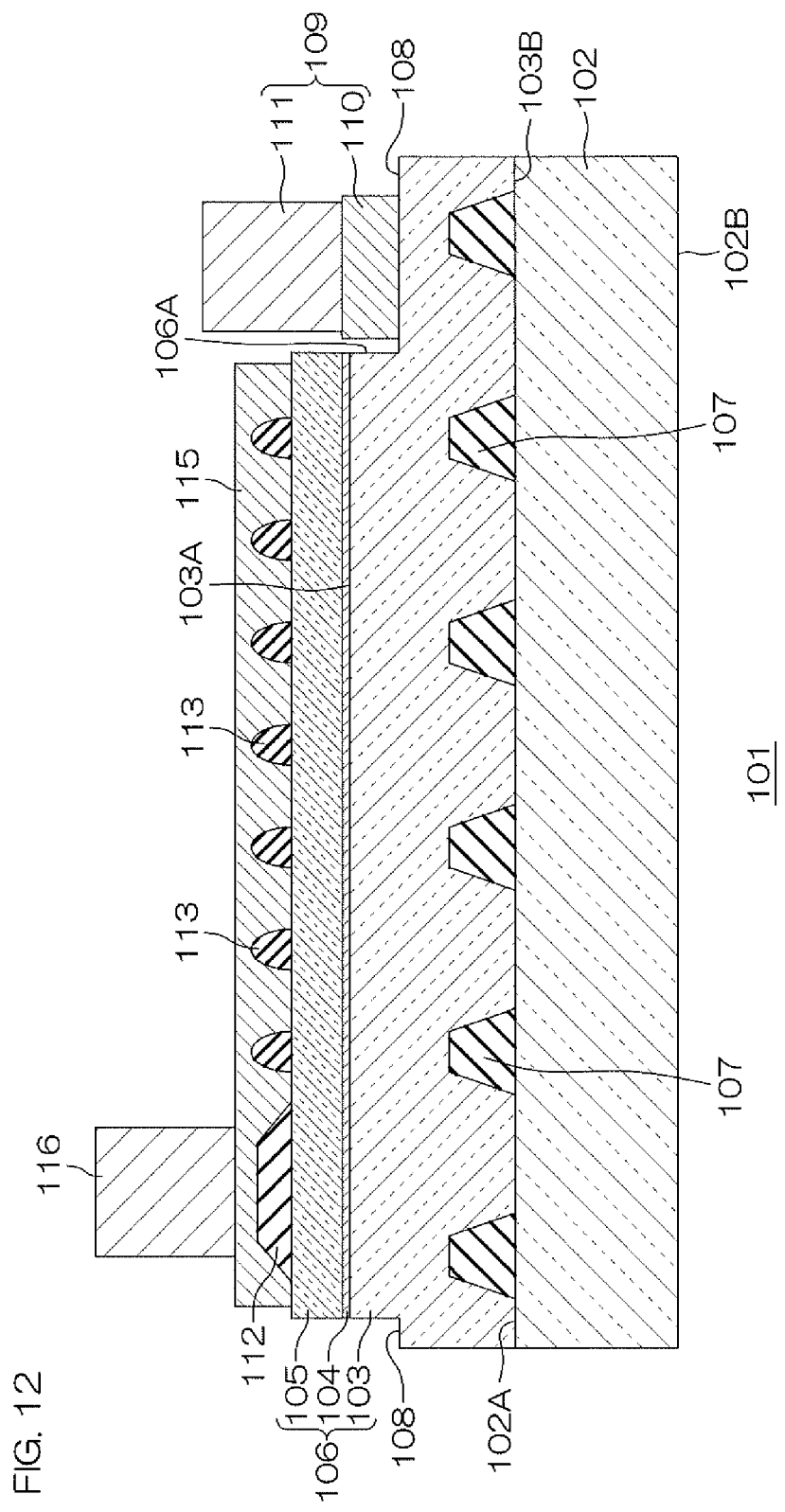
FIG. 12 is a schematic sectional view of the light emitting device in FIG. 11.

FIG. 11 is a schematic plan view of a light emitting device according to a preferred embodiment of the second invention. FIG. 12 is a schematic sectional view of the light emitting device in FIG. 11.

A light emitting device 101 is a quadrangular chip at a planar view. The light emitting device 101 includes a substrate 102 having a surface 102A and a rear surface 102B, and an n-type conductive type semiconductor layer 103, a light emitting layer 104 and a p-type conductive type semiconductor layer 105 which are laminated in series on the surface 102A of the substrate 102. The n-type conductive type semiconductor layer 103 will be hereinafter referred to as "n-type semiconductor layer 103," and the p-type conductive type semiconductor layer 105 will be hereinafter referred to as "p-type semiconductor layer 105." The substrate 102 is a quadrangular shape at a planar view. The light emitting layer 104, the p-type semiconductor layer 105, and a portion of the n-type semiconductor layer 103 excluding the vicinity of the peripheral portion compose a semiconductor laminate structure portion 106. The semiconductor laminate structure portion 106 is a quadrangular shape substantially similar to the substrate 102 at a planar view, and has a cutout portion 106A at one corner portion. A side surface of the cutout portion 106A is formed to have a curved surface which protrudes inward at a planar view.

The substrate 102 is made of material (e.g., sapphire, GaN or SiC) transparent to the emission wavelength λ (e.g., 450 nm) of the light emitting layer 104. "Transparent to emission wavelength" specifically denotes a case where the transmittance of the emission wavelength is equal to or higher than 60%, for example. In this preferred embodiment, the substrate 102 is a sapphire substrate. The substrate 102 has a thickness of 200 μm to 300 μm, for example.

Figure 13A:
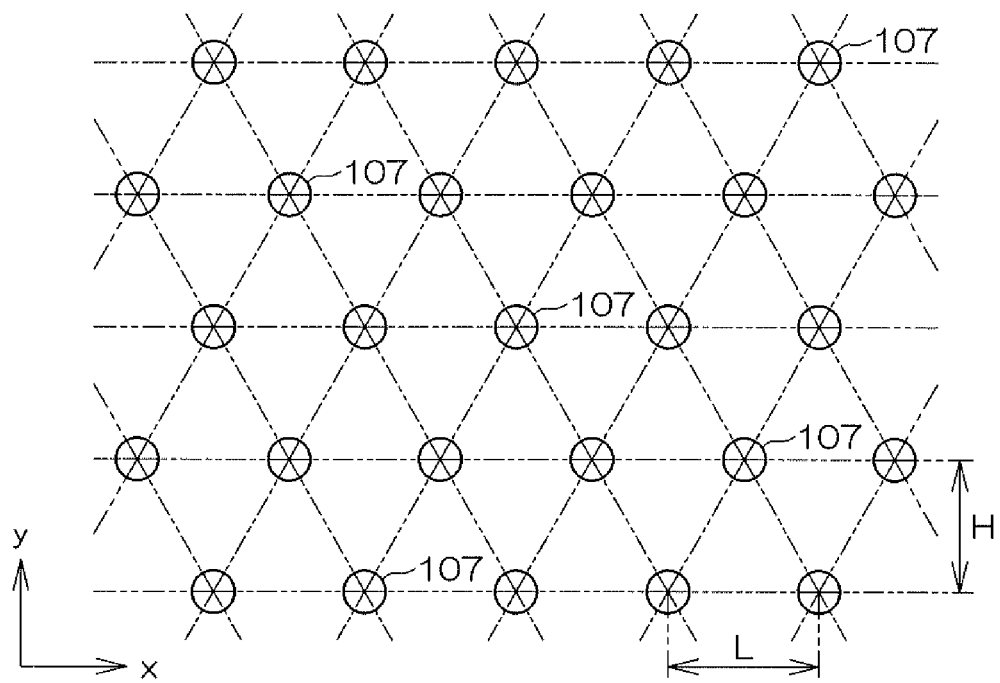
FIG. 13A is a schematic plan view illustrating an example of an arrangement pattern of convex portions.

A plurality of frustum convex portions 107 which protrude to the n-type semiconductor layer 103 are formed on the surface 102A of the substrate 102. The convex portions 107 are arranged discretely as illustrated in FIG. 13A. In FIG. 13A, a direction along one side of two adjacent sides of the surface 102A of the substrate 102 at a planar view is represented as an x-direction, and a direction along the other side is represented as a y-direction. In this preferred embodiment, a plurality of convex portions 107 are formed on the surface 102A of the substrate 102 in a pattern where the convex portions 107 are arranged at the respective vertexes and centers (centers of gravity) of each regular hexagon in aggregate of regular hexagons at a planar view. In other words, the plurality of convex portions 107 are formed on the surface 102A of the substrate 102 in a pattern where the convex portions 107 are arranged at the respective vertexes of six regular triangles which compose each regular hexagon in aggregate of regular hexagons. In this preferred embodiment, each convex portion 107 is formed of SiN. Each convex portion 107 may be formed by etching the surface 102A of the substrate 102.

Figure 13B:
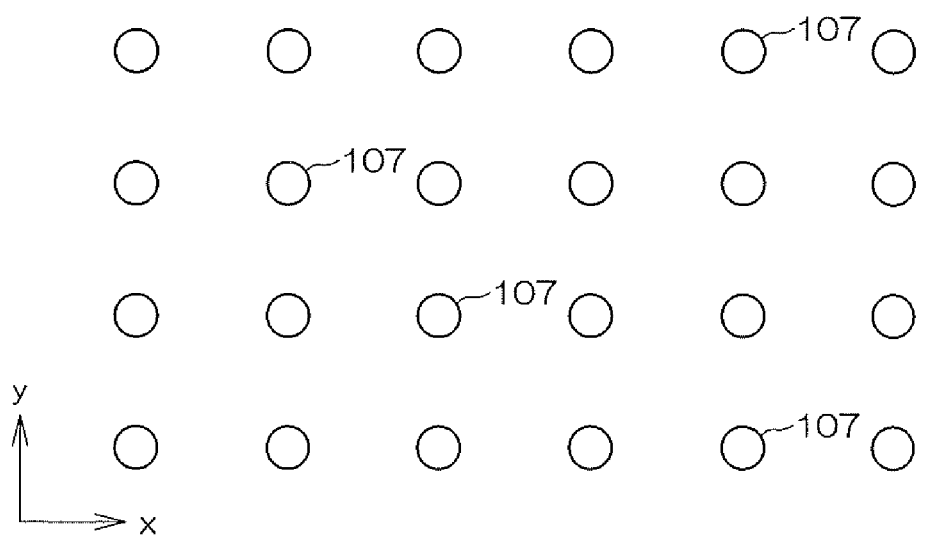
FIG. 13B is a schematic plan view illustrating another example of an arrangement pattern of convex portions.

The plurality of convex portions 107 may be arranged in a matrix at intervals as illustrated in FIG. 13B.

Since the convex portions 107 are formed on the surface 102A of the substrate 102, it is possible to suppress total reflection of light at the interface between the surface 102A of the substrate 102 and the n-type semiconductor layer 103. This can improve the light extraction efficiency. For example, it is possible to suppress total reflection of light, which is reflected at the rear surface 102B of the substrate 102 and enters the interface between the substrate 102 and the n-type semiconductor layer 103 at various angles, at the interface to the rear surface 102B side of the substrate 102. This can improve the light extraction efficiency.

The n-type semiconductor layer 103 is laminated on the surface 102A of the substrate 102. Then-type semiconductor layer 103 covers the whole area of the surface 102A of the substrate 102. All convex portions 107 are covered with the n-type semiconductor layer 103. The n-type semiconductor layer 103 is made of n-type GaN, and is transparent to the emission wavelength λ of the light emitting layer 104.

Regarding the n-type semiconductor layer 103, a lower surface covering the surface 102A of the substrate 102 in FIG. 12 will be referred to as a rear surface 103B, and an upper surface on a side opposite to the rear surface 103B will be referred to as a surface 103A. The surface 103A of the n-type semiconductor layer 103 includes a higher position region in a central portion and a lower position region, which is located around the higher position region and is lower than the higher position region. This forms a step at a boundary portion between the higher position region and the lower position region on the surface 103A of the n-type semiconductor layer 103.

The n-type semiconductor layer 103 in the higher position region constitutes an n-type semiconductor layer in the semiconductor laminate structure portion 106. The n-type semiconductor layer 103 in the lower position region will be referred to as a lead portion 108 extended from the semiconductor laminate structure portion 106. A side surface of the lead portion 108 is extended outward up to a position flush with a side surface of the substrate 102. The lead portion 108 is formed to surround the semiconductor laminate structure portion 106.

On a surface of the lead portion 108, an n-side electrode 109 is formed in contact with a region corresponding to the cutout portion 106A of the semiconductor laminate structure portion 106. The n-side electrode 109 is composed of an n-side transparent electrode layer 110, which is formed on a surface of the lead portion 108, and an n-side pad 111, which is formed on the n-side transparent electrode layer 110. The n-side transparent electrode layer 110 is a quadrangular shape having four sides parallel to the four sides of the substrate 102 at a planar view, and a corner portion facing a side surface of the cutout portion 106A of the semiconductor laminate structure portion 106 is formed to have a curved surface which protrudes outward. The n-side transparent electrode layer 110 is made of material (e.g., ITO or ZnO) transparent to the emission wavelength λ of the light emitting layer 104, for example. The n-side pad 111 is a circular shape at a planar view. The n-side pad 111 is made of Cr or Au, for example.

The light emitting layer 104 is laminated on the n-type semiconductor layer 103. The light emitting layer 104 covers the whole area of the higher position region on the surface 103A of the n-type semiconductor layer 103. In this preferred embodiment, the light emitting layer 104 is made of a nitride semiconductor (e.g., InGaN) including In.

The p-type semiconductor layer 105 is laminated on the light emitting layer 104. The p-type semiconductor layer 105 covers the whole area of a surface of the light emitting layer 104. The p-type semiconductor layer 105 is made of p-type GaN, and is transparent to the emission wavelength λ of the light emitting layer 104. A light emitting diode structure (semiconductor laminate structure portion 106) having the light emitting layer 104 sandwiched between the n-type semiconductor layer 103 and the p-type semiconductor layer 105 is formed in such a manner.

On a surface of the p-type semiconductor layer 105 on a side opposite to the light emitting layer 104, a first insulating film (current interruption insulating film) 112, which is a circular shape at a planar view, is formed at a position close to a corner facing the cutout portion 106A of the semiconductor laminate structure portion 106. Moreover, a plurality of second insulating films (transparent insulating films) 113, which respectively are a circular shape at a planar view, are formed in a predetermined current injection region 114 on a surface of the p-type semiconductor layer 105. The first insulating film 112 and the second insulating films 113 are made of SiO$_2$, which is transparent to the emission wavelength λ of the light emitting layer 104, for example. In this preferred embodiment, the current injection region 114 is set in a region on a surface of the p-type semiconductor layer 105 excluding the peripheral portion. A region on a surface of the p-type semiconductor layer 105 where the first insulating film 112 is formed is included in the current injection region 114.

A p-side transparent electrode layer 115 is formed in the current injection region 114 on a surface of the p-type semiconductor layer 105. The first insulating film 112 and the second insulating films 113 are covered with the p-side transparent electrode layer 115. The p-side transparent electrode layer 115 is made of material (e.g., ITO or ZnO) transparent to the emission wavelength λ, of the light emitting layer 104, for example. The p-side transparent electrode layer 115 has a thickness of approximately 100 nm to 300 nm, for example. The second insulating films 113 have a thickness equal to or larger than 10 nm and equal to or smaller than 5000 nm, for example. In order to improve the light extraction effect, the second insulating films 113 preferably have a thickness equal to or larger than 1500 nm.

On a surface of the p-side transparent electrode layer 115 on aside opposite to the p-type semiconductor layer 105, a p-side electrode (p-side pad) 116 is formed at a position facing a surface of the first insulating film 112 (position right above the first insulating film 112 in FIG. 12). The p-side electrode 116 is a circular shape having a diameter smaller than the first insulating film 112 at a planar view. The p-side electrode 116 is made of Cr or Au, for example. As is well known, the aforementioned first insulating film 112 is provided in order to let electric current flow to a portion of the semiconductor laminate structure portion 106 excluding a portion right below the p-side electrode 116 and reduce light interrupted by the p-side electrode 116.

Figure 14A:
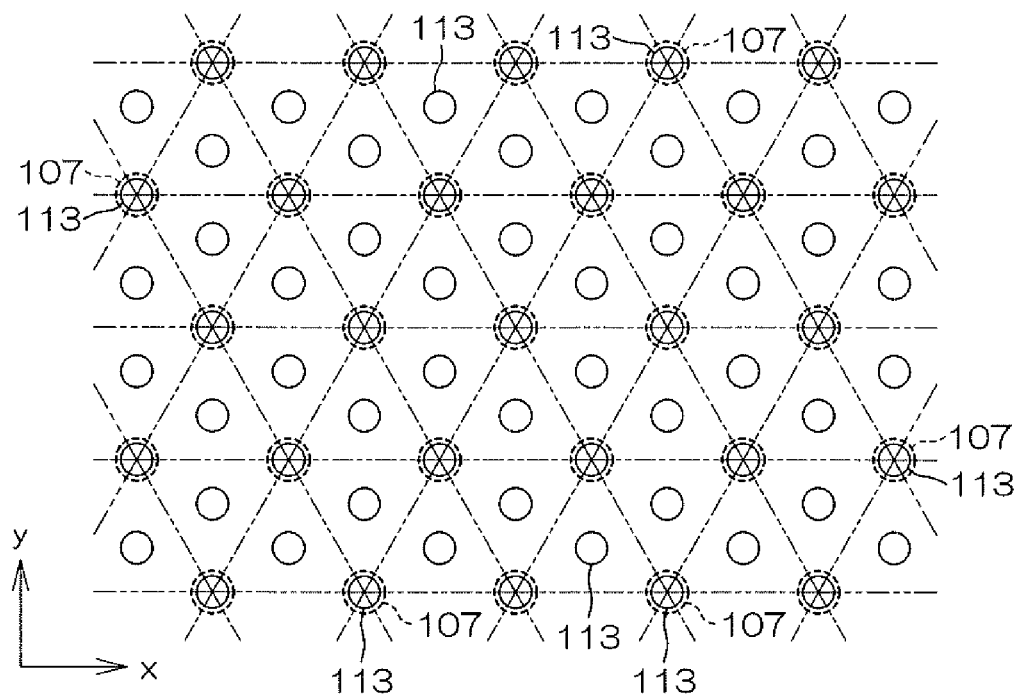
FIG. 14A is a schematic plan view illustrating an example of an arrangement pattern of second insulating films in a case where the convex portions are arranged in the arrangement pattern in FIG. 13A.

The second insulating films (transparent insulating films) 113 are arranged discretely as illustrated in FIG. 14A. In this preferred embodiment, the second insulating films 113 are formed at positions right above the centers of the respective convex portions 107 formed on the substrate 102 (positions facing the respective convex portions 107), and at positions right above the central positions of a plurality of two-dimensionally adjacent convex portions 107 among the plurality of convex portions 107 (positions facing central positions of three two-dimensionally adjacent convex portions 107). In a case where convex portions 107 are arranged at the respective vertexes of six regular triangles which compose each regular hexagon in aggregate of regular hexagons as illustrated in FIG. 14A, the respective centers of gravity of the respective regular triangles become central positions of three two-dimensionally adjacent convex portions 107. Accordingly, in such a case, the second insulating films 113 are arranged at the respective vertexes and the respective centers of gravity of six regular triangles which compose each regular hexagon.

Second insulating films 113 may be arranged only at positions right above the centers of convex portions 107 formed on the substrate 102. That is, second insulating films 113 may be arranged only at the respective vertexes of six regular triangles which compose each regular hexagon illustrated in FIG. 14A.

Second insulating films 113 may be formed only at positions right above the central positions of three two-dimensionally adjacent convex portions 107 among the plurality of convex portions 107 formed on the substrate 102. That is, second insulating films 113 may be arranged only at the respective centers of gravity of six regular triangles which compose each regular hexagon illustrated in FIG. 14A.

Figure 14B:
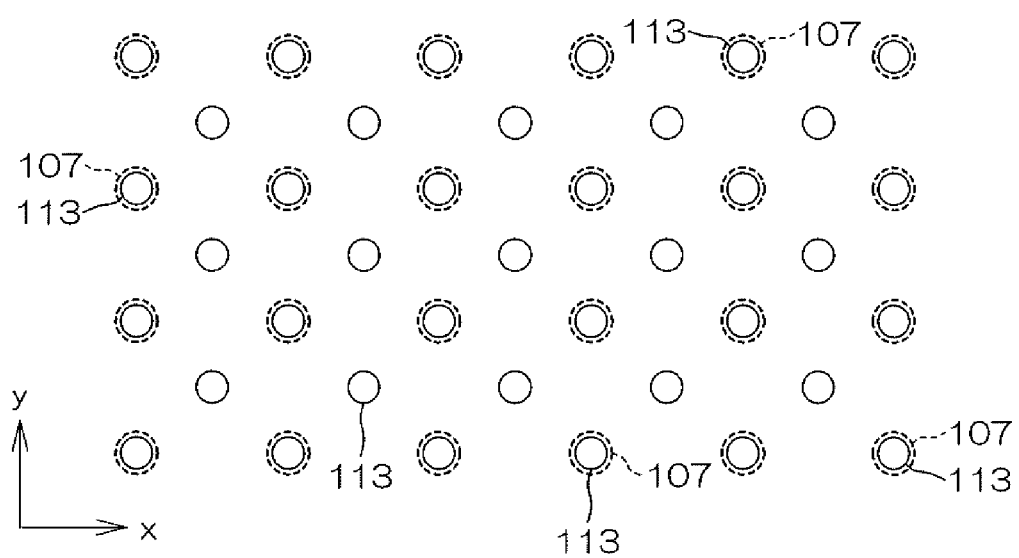
FIG. 14B is a schematic plan view illustrating an example of an arrangement pattern of second insulating films in a case where the convex portions are arranged in the arrangement pattern in FIG. 13B.

In a case where the convex portions 107 are arranged in a matrix as illustrated in FIG. 13B, the plurality of second insulating films 113 may be arranged at positions right above the centers of the respective convex portions 107 (positions facing the respective convex portions 107) at a planar view and at central positions of four two-dimensionally adjacent convex portions 107 as illustrated in FIG. 14B.

In a case where the convex portions 107 are arranged in a matrix as illustrated in FIG. 13B, the plurality of second insulating films 113 may be arranged only at positions right above the centers of the respective convex portions 107 at a planar view, or may be arranged only at positions right above the central positions of four two-dimensionally adjacent convex portions 107.

FIGS. 15A to 15F are simulative sectional views illustrating a method for manufacturing a light emitting device illustrated in FIGS. 11 and 12.

Figure 15A:
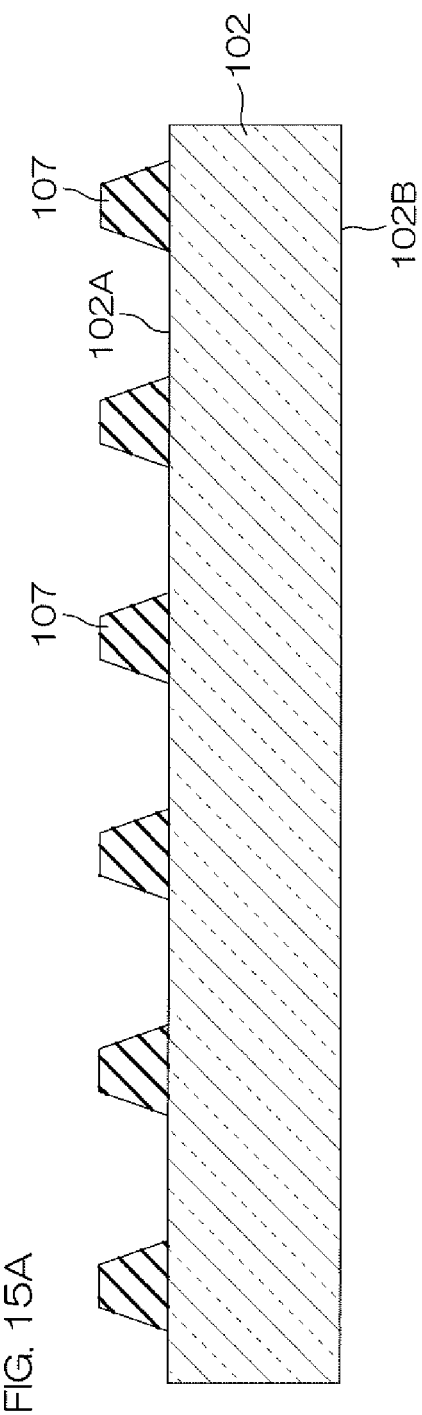
FIG. 15A is a schematic sectional view illustrating a method for manufacturing the light emitting device illustrated in FIGS. 11 and 12.

First, as illustrated in FIG. 15A, a layer (SiN) made of SiN is formed on the surface 102A of the substrate 102, and the SiN layer is separated into the plurality of convex portions 107 by etching which uses a resist pattern (illustration is omitted) as a mask. Next, as illustrated in FIG. 15B, a layer (n-GaN layer) made of n-type GaN is formed on the surface 102A of the substrate 102 so as to cover all convex portions 107. This forms the n-type semiconductor layer 103 on the surface 102A of the substrate 102.

Next, as illustrated in FIG. 15C, a nitride semiconductor (e.g., InGaN layer) including In is formed on a surface of the n-type semiconductor layer 103. This forms the light emitting layer 104 on a surface of the n-type semiconductor layer 103. The emission wavelength λ of the light emitting layer 104 is controlled to be 440 nm to 460 nm by adjusting the composition of In or Ga. Next, a layer (p-GaN layer) made of p-type GaN is formed on a surface of the light emitting layer 104. This forms the p-type semiconductor layer 105 on a surface of the light emitting layer 104.

Next, a resist pattern (illustration is omitted) having openings at regions where the first insulating film 112 and the second insulating films 113 are to be formed is formed on the p-type semiconductor layer 105. Then, as illustrated in FIG. 15D, the first insulating film 112 and the second insulating films 113 made of SiO$_2$ are formed via the resist pattern by sputtering or plasma CVD, for example.

Next, a resist pattern (illustration is omitted) having an opening at a region (current injection region 114) where the p-side transparent electrode layer 115 is to be formed is formed on the p-type semiconductor layer 105. Then, a layer (ITO layer) made of ITO is stacked on the p-type semiconductor layer 105 via the resist pattern by sputtering, for example. Then, an unnecessary portion of ITO material is lifted off together with the resist pattern. This forms the p-side transparent electrode layer 115, which covers the first insulating film 112 and the second insulating films 113, on a surface of the p-type semiconductor layer 105 as illustrated in FIG. 15E.

Next, as illustrated in FIG. 15F, the p-type semiconductor layer 105, the light emitting layer 104 and the n-type semiconductor layer 103 are respectively removed selectively by etching which uses a resist pattern (illustration is omitted) as a mask. This forms the semiconductor laminate structure portion 106 and the lead portion 108, which is extended from the semiconductor laminate structure portion 106.

Thereafter, the n-side electrode 109 is formed on a surface of the lead portion 108 (n-type semiconductor layer 103), and the p-side electrode 116 is formed in a region on a surface of the p-side transparent electrode layer 115 right above the first insulating film 112. This provides the light emitting device illustrated in FIGS. 11 and 12.

In such a light emitting device 101, electric current flows from the p-side electrode 116 toward the n-side electrode 109 when forward voltage is applied across the n-side electrode 109 (n-side pad 111) and the p-side electrode (p-side pad) 116. Electric current flows from the p-side electrode 116 through the p-side transparent electrode layer 115, the p-type semiconductor layer 105, the light emitting layer 104 and the n-type semiconductor layer 103 in this order toward the n-side electrode 109. As electric current flows in such a manner, electrons are injected from the n-type semiconductor layer 103 to the light emitting layer 104, and holes are injected from the p-type semiconductor layer 105 to the light emitting layer 104. Then, the holes and electrons recombine in the light emitting layer 104, so that light having a wavelength of 440 nm to 460 nm is generated from the light emitting layer 104. The light is transmitted through the p-type semiconductor layer 105 and the p-side transparent electrode layer 115 and is extracted from a surface of the p-side transparent electrode layer 115.

Light, which travels from the light emitting layer 104 toward the n-type semiconductor layer 103 side, is transmitted through the n-type semiconductor layer 103. Then, part of the light is reflected at the interface between the n-type semiconductor layer 103 and the substrate 102, at the rear surface of the substrate 102, or the like. Reflected light is transmitted through the n-type semiconductor layer 103, the light emitting layer 104, the p-type semiconductor layer 105 and the p-side transparent electrode layer 115 in this order and is extracted from a surface of the p-side transparent electrode layer 115.

In this preferred embodiment, a plurality of second insulating films 113 are formed on a surface of the p-type semiconductor layer 105. This reflects light, which enters the p-side transparent electrode layer 115 from the semiconductor laminate structure portion 106, at a side surface of the second insulating films 113 and extracts light from a surface of the p-side transparent electrode layer 115 on a side opposite to the p-type semiconductor layer 105, and therefore the light extraction efficiency can be improved.

Moreover, in this preferred embodiment, a plurality of convex portions 107 are formed on the surface 102A of the substrate 102, and therefore the light extraction efficiency can be improved.

In a case where a plurality of convex portions 107 are formed on the surface 102A of the substrate 102, since lateral growth joins crystal growth of the n-type semiconductor layer 103 on the substrate 102 in regions in the n-type semiconductor layer 103 right above the centers of the convex portions 107, a defect portion is likely to occur in the regions. Moreover, defect of the substrate 102 is likely to be taken over and a defect portion is likely to occur in a region in the n-type semiconductor layer 103 right above a central position of a plurality of two-dimensionally adjacent convex portions 107 among the plurality of convex portions 107. In a case where a defect portion exists in the n-type semiconductor layer 103, the resistance value of the defect portion is low, and therefore electric current flows to the defect portion in a concentrated manner and the light emitting device 101 may possibly be broken.

In this preferred embodiment, the second insulating films 113 are arranged at positions right above the central positions of the respective convex portions 107, and the second insulating films 113 are arranged at positions right above the central positions of a plurality of two-dimensionally adjacent convex portions 107 among the plurality of convex portions 107. That is, the second insulating films 113 are arranged right above the portions in the n-type semiconductor layer 103 where a defect portion is likely to occur. This makes it difficult for electric current from the p-side transparent electrode layer 115 to flow to a portion in the n-type semiconductor layer 103 where a defect portion is likely to occur. This can suppress concentrated flow of electric current to the defect portion, and therefore reliability of the light emitting device 101 can be improved.

Moreover, around the interface in the outermost portion of the p-type semiconductor layer 105 with the second insulating films 113, damage in the second insulating films 113 during film formation increases n-type carriers and cancels p-type carriers, and therefore the electric resistance becomes larger. This can make it difficult for electric current to flow to a portion where a defect portion is likely to occur, and therefore reliability of the light emitting device 101 can be further improved.

Figure 16:
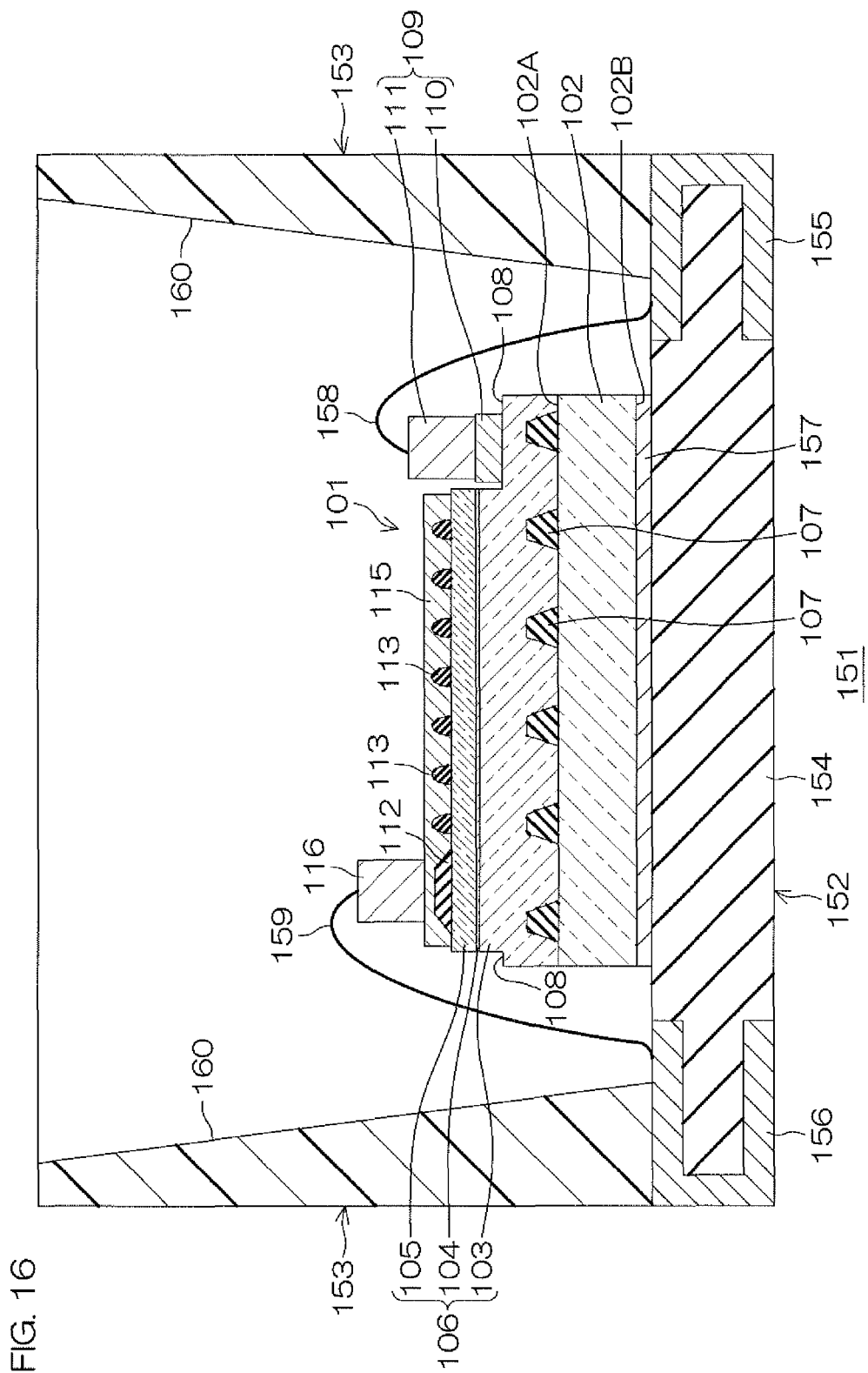
FIG. 16 is a schematic sectional view of a light emitting device package.

FIG. 16 is a schematic sectional view of a light emitting device package.

A light emitting device package 151 includes the light emitting device 101, a support substrate 152 and a resin package 153. The support substrate 152 is provided with an insulating substrate 154 arranged to support the light emitting device 101, and a pair of electrodes 155 and 156 which are provided to be exposed from both ends of the insulating substrate 154.

The light emitting device 101 is supported by the support substrate 152 at an attitude where the surface 102A of the substrate 102 faces upward. Specifically, the rear surface 102B of the substrate 102 in the light emitting device 101 is bonded with the insulating substrate 154 via an adhesive layer 157. That is, the light emitting device 101 is mounted face up. The n-side electrode 109 (n-side pad 111) of the light emitting device 101 and one electrode 155 are connected with each other via a wire 158. The p-side electrode 116 of the light emitting device 101 and the other electrode 156 are connected with each other via a wire 159.

The resin package 153 is a case filled with resin, and is fixed to the support substrate 152 with the light emitting device 101 accommodated therein (covered therewith) and protected. The resin package 153 has a reflector 160, which is arranged to reflect light emitted from the light emitting device 101 and extract the light, on a lateral surface (portion facing the light emitting device 101). The reflector 160 is made of resin, for example.

Some resins to constitute the resin package 153 contain fluorescent material or a reflecting agent. For example, in a case where the light emitting device 101 emits blue light, the light emitting device package 151 can emit white light when the resin contains yellow fluorescent material. Assembly of a number of light emitting device packages 151 can be used for lighting equipment such as an electric bulb, and also can be used for a backlight of a liquid crystal television or for a headlamp of an automobile or the like.

In such a light emitting device package 151, light emitted in the light emitting layer 104 of the light emitting device 101 is immediately transmitted through the p-type semiconductor layer 105 and emitted from a surface of the p-side transparent electrode layer 115, or is transmitted through the n-type semiconductor layer 103 and reflected once at the rear surface 102B of the substrate 102 or the like and is then emitted from a surface of the p-side transparent electrode layer 115.

FIG. 17 is a schematic sectional view illustrating another example of a light emitting device package.

A light emitting device package 171 includes the light emitting device 101, a support substrate 172 and a resin package 173. The support substrate 172 is provided with an insulating substrate 174 arranged to support the light emitting device 101, a pair of electrodes 175 and 176 which are provided to be exposed from both ends of the insulating substrate 174, an n-side electrode layer 177 and a p-side electrode layer 178, which are formed on a surface of the insulating substrate 174 in the resin package 173, and an n-side junction layer 179 and a p-side junction layer 180 which are formed respectively on a surface of the n-side electrode layer 177 and a surface of the p-side electrode layer 178. The n-side electrode layer 177 is connected with one electrode 175. The p-side electrode layer 178 is connected with the other electrode 176.

The light emitting device 101 is supported by the support substrate 172 at an attitude in which the surface 102A of the substrate 102 faces downward. Specifically, a surface of the n-side electrode 109 (n-side pad 111) in the light emitting device 101 is bonded with the n-side junction layer 179, and a surface of the p-side electrode 116 in the light emitting device 101 is bonded with the p-side junction layer 180. That is, the light emitting device 101 is mounted face down. A reflector 181 arranged to reflect light transmitted through the p-side transparent electrode layer 115 of the light emitting device 101 is formed in a required portion on a surface of the insulating substrate 174. The reflector 181 is made of resin, for example.

The resin package 173 is a case filled with resin, and is fixed to the support substrate 172 with the light emitting device 101 accommodated therein (covered therewith) and protected. The resin package 173 has a reflector 182, which is arranged to reflect light emitted from the light emitting device 101 and extract the light, on a lateral surface (portion facing the light emitting device 101). The reflector 182 is made of resin, for example.

In such a light emitting device package 171, light emitted in the light emitting layer 104 of the light emitting device 101 is immediately transmitted through the n-type semiconductor layer 103 and emitted from a rear surface 102B of the substrate 102, or is transmitted through the p-type semiconductor layer 105 and the p-side transparent electrode layer 115 and reflected at the reflector 181 and is then emitted from the rear surface 102B of the substrate 102.

Although the above description has explained a preferred embodiment of the second invention, the second invention can be further implemented in another preferred embodiment. Although the second insulating films 113 in the above preferred embodiment are formed in a circular shape at a planar view, second insulating films 113 may be formed in a polygonal shape (quadrangular shape, hexagonal shape or the like) at a planar view.

Moreover, although GaN is illustrated as a nitride semiconductor which constitutes the n-type semiconductor layer 103 and the p-type semiconductor layer 105 in the above preferred embodiment, another nitride semiconductor such as aluminum nitride (AlN) or indium nitride (InN) may be used. A nitride semiconductor can be represented generally as $Al_xIn_yGa_{(1-x-y)}N$ ($0 \leq x \leq 1$, $0 \leq y \leq 1$, $0 \leq x+y \leq 1$). Moreover, the present invention may be applied to a light emitting device which is not provided with a nitride semiconductor but provided with another compound semiconductor such as GaAs or semiconductor material other than a compound semiconductor (e.g., diamond).

Although the above description has explained preferred embodiments of the present invention in detail, the preferred embodiments are only concrete examples to be used for clarifying the technical content of the present invention, and therefore the present invention is not to be interpreted as exclusive to the concrete examples and the scope of the present invention is limited only by the appended claims.

The present application corresponds to Japanese Patent Application No. 2014-8003 filed with the Japanese Patent Office on Jan. 20, 2014, Japanese Patent Application No. 2014-8004 filed with the Japanese Patent Office on Jan. 20, 2014, and Japanese Patent Application No. 2015-6748 filed with the Japanese Patent Office on Jan. 16, 2015, the entire disclosures of which are incorporated herein by reference.

What is claimed is:

1. A light emitting device comprising:
   a substrate having a surface and a rear surface;
   a semiconductor laminate structure portion having an n-type semiconductor layer, a light emitting layer and a p-type semiconductor layer which are laminated in series on the surface of the substrate, the p-type semiconductor layer having a surface on a side opposite to the light emitting layer;
   a plurality of concave portions which are discretely arranged to be formed in a predetermined current injection region at the surface of the p-type semiconductor layer to penetrate in-between portions of the semiconductor laminate structure portion, extend into the semiconductor laminate structure portion from the p-type semiconductor layer, and in a plan view the plurality of concave portions being arranged in a matrix pattern;
   a transparent electrode layer which is formed on the surface of the p-type semiconductor layer and covers a whole area of the predetermined current injection region on the surface of the p-type semiconductor layer or a substantially whole area of the predetermined current injection region on the surface of the p-type semiconductor layer;
   a p-side electrode which is formed on a surface of the transparent electrode layer on a side opposite to the p-type semiconductor layer; and
   a convex region formed by the semiconductor laminate structure portion, each part of the convex region between the plurality of concave portions having a current injected thereinto from the transparent electrode layer,
   wherein the concave portions are formed to extend from the surface of the transparent electrode layer, on a side opposite to the semiconductor laminate structure portion, through the transparent electrode layer, the p-type semiconductor layer, and the light-emitting layer, and penetrating the n-type semiconductor layer in a thickness direction,
   a side surface of an inner wall surface of each concave portion has an inclined plane which is inclined with respect to the surface of the substrate, and
   an insulating layer is formed on the entire inner wall surface of each concave portion.

2. The light emitting device according to claim 1, further comprising:
   a lead portion which is electrically connected with the n-type semiconductor layer and is extended from the semiconductor laminate structure portion in a direction parallel to the substrate; and
   an n-side electrode formed on the lead portion.

3. The light emitting device according to claim 1, wherein
a plurality of convex portions covered with the n-type semiconductor layer are formed on the surface of the substrate, and
the plurality of concave portions include a first concave portion, which is located to face a portion in the n-type semiconductor layer where a defect is likely to occur.

4. The light emitting device according to claim 3, wherein the plurality of concave portions includes concave portions which are located to face each of the plurality of convex portions.

5. The light emitting device according to claim 3, wherein the plurality of concave portions includes a concave portion, which is located to face a central position of a plurality of two-dimensionally adjacent convex portions among the plurality of convex portions.

6. The light emitting device according to claim 3, wherein
the convex portions are constituted of an insulating film, which is formed on the surface of the substrate.

7. The light emitting device according to claim 3, wherein the convex portions are formed by etching the surface of the substrate.

8. The light emitting device according to claim 2, wherein
a plurality of convex portions covered with the n-type semiconductor layer is formed on the surface of the substrate, and
the plurality of concave portions includes a first concave portion, which is located to face a portion in the n-type semiconductor layer where a defect is likely to occur.

9. The light emitting device according to claim 8, wherein the plurality of concave portions includes concave portions which are located to face each of the plurality of convex portions.

10. The light emitting device according to claim 8, wherein the plurality of concave portions include a concave portion, which is located to face a central position of a plurality of two-dimensionally adjacent convex portions among the plurality of convex portions.

11. The light emitting device according to claim 8, wherein the convex portions are constituted of an insulating film formed on the surface of the substrate.

12. The light emitting device according to claim 4, wherein the convex portions are constituted of an insulating film formed on the surface of the substrate.

13. The light emitting device according to claim 1, wherein
the matrix pattern is defined by an arrangement of the plurality of concave portions in which, in the plan view, a line between any two concave portions, having no concave portions between the two concave portions along the line between two concave portions, defines a first direction, and an intervening concave portion is located between the two concave portions in the first direction, offset from the line in a second direction perpendicular to the first direction.

14. The light emitting device according to claim 1, wherein
the matrix pattern is a grid pattern of rows and columns arranged perpendicularly.

15. The light emitting device according to claim 1, further comprising a plurality of convex portions covered with the n-type semiconductor layer formed on the surface of the substrate,
wherein the plurality of convex portions and the plurality of concave portions are configured so as to be arranged, in the plan view, in a plurality of adjacent hexagons, each hexagon having at each corner both a convex portion and a concave portion, and having at a center both a convex portion and a concave portion, each hexagon defined by six triangles, each triangle defined by an apex at the center of the hexagon and a base at an outside edge of the hexagon, each triangle having therein, in the plan view, a concave portion.

* * * * *